(12) United States Patent
Vernickel et al.

(10) Patent No.: US 9,933,503 B2
(45) Date of Patent: Apr. 3, 2018

(54) MEASUREMENT OF MAGNETIC RESONANCE RHEOLOGY TRANSDUCER VIBRATIONS USING NAVIGATORS

(71) Applicant: KONINKLIJKE PHILIPS N.V., Eindhoven (NL)

(72) Inventors: Peter Vernickel, Hamburg (DE); Daniel Wirtz, Hamburg (DE); Christoph Leussler, Hamburg (DE); Peter Mazurkewitz, Hamburg (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 500 days.

(21) Appl. No.: 14/426,842

(22) PCT Filed: Sep. 9, 2013

(86) PCT No.: PCT/EP2013/068626
§ 371 (c)(1),
(2) Date: Mar. 9, 2015

(87) PCT Pub. No.: WO2014/040954
PCT Pub. Date: Mar. 20, 2014

(65) Prior Publication Data
US 2015/0241540 A1    Aug. 27, 2015

Related U.S. Application Data

(60) Provisional application No. 61/699,409, filed on Sep. 11, 2012.

(30) Foreign Application Priority Data

Sep. 11, 2012    (EP) ..................................... 12183890

(51) Int. Cl.
*G01R 33/563*    (2006.01)
*G01R 33/30*    (2006.01)
(Continued)

(52) U.S. Cl.
CPC ..... *G01R 33/56375* (2013.01); *G01R 33/307* (2013.01); *G01R 33/385* (2013.01);
(Continued)

(58) Field of Classification Search
CPC ............ G01R 33/56375; G01R 33/307; G01R 33/3815; G01R 33/385; G01R 33/5608;
(Continued)

(56) References Cited

U.S. PATENT DOCUMENTS 4,214,962 A     7/1980  Pincon
5,825,186 A *  10/1998  Ehman ................... A61B 5/055
                                                            324/307

(Continued)

FOREIGN PATENT DOCUMENTS

CH          683517 A5      3/1994
CN        1350983 A        5/2002
(Continued)

OTHER PUBLICATIONS

Rossman, P. et al "Piezoelectric Bending Elements for use as Motion Actuators in MR Elastography", Proceedings of the International Society for Magnetic Resonance in Medicine, vol. 1, 2003, pp. 1075.
(Continued)

*Primary Examiner* — Rodney Bonnette

(57) ABSTRACT

The invention provides for a medical instrument (200, 400, 500) comprising a magnetic resonance imaging system (202), a transducer (222) for mechanically vibrating at least a portion of the subject within the imaging zone. Instructions cause a processor (236) controlling the medical instrument to: control (100) the transducer to vibrate; control (102) the magnetic resonance imaging system to repeatedly acquire the magnetic resonance data (252) using a first spatially encoding pulse sequence (250); control (104) the magnetic (Continued)

resonance imaging system to acquire navigator data (256) using a second spatially encoding pulse sequence (254); construct (106) a set of navigator profiles (258, 804, 904, 1004, 1108, 1208, 1308) using the navigator data; determine (108) at least one parameter (260) descriptive of transducer vibrations using the set of navigator profiles; and reconstruct (110) at least one magnetic resonance rheology image (262) from the magnetic resonance data.

15 Claims, 17 Drawing Sheets

(51) Int. Cl.
*G01R 33/3815* (2006.01)
*G01R 33/385* (2006.01)
*G01R 33/56* (2006.01)
*G01R 33/567* (2006.01)
G01R 33/565 (2006.01)

(52) U.S. Cl.
CPC ....... *G01R 33/3815* (2013.01); *G01R 33/567* (2013.01); *G01R 33/5608* (2013.01); *G01R 33/5676* (2013.01); *G01R 33/56358* (2013.01); *G01R 33/56509* (2013.01); *G01R 33/56563* (2013.01)

(58) Field of Classification Search
CPC ............ G01R 33/56358; G01R 33/567; G01R 33/5676; G01R 33/56509; G01R 33/56563
See application file for complete search history.

(56) References Cited

U.S. PATENT DOCUMENTS

| | | | |
|---|---|---|---|
| 5,952,828 | A | 9/1999 | Rossman |
| 7,205,763 | B2 | 4/2007 | Porter |
| 7,307,423 | B2 | 12/2007 | Ehman |
| 8,334,692 | B2 | 12/2012 | Harvey et al. |
| 8,974,445 | B2 | 3/2015 | Warnking et al. |
| 9,389,291 | B2 | 7/2016 | Mitsushi |
| 2002/0036500 | A1 | 3/2002 | Uetake et al. |
| 2005/0237057 | A1 | 10/2005 | Porter |
| 2006/0264736 | A1 | 11/2006 | Ehman et al. |
| 2007/0170917 | A1 | 7/2007 | Thompson |
| 2008/0154117 | A1 | 6/2008 | Nielles-Vallespin |
| 2009/0177076 | A1 | 7/2009 | Aldefeld et al. |
| 2009/0270712 | A1 | 10/2009 | Raghavan et al. |
| 2009/0281421 | A1* | 11/2009 | Culp ............... A61N 5/0601 600/426 |
| 2010/0072985 | A1 | 3/2010 | Kess |
| 2010/0174188 | A1 | 7/2010 | Wang et al. |
| 2010/0308830 | A1 | 12/2010 | Shankar |
| 2010/0331690 | A1 | 12/2010 | Li |
| 2011/0025333 | A1 | 2/2011 | Ehman |
| 2011/0112393 | A1 | 5/2011 | Taniguchi et al. |
| 2012/0010497 | A1* | 1/2012 | Ehman ............ G01R 33/3806 600/410 |
| 2017/0086703 | A1* | 3/2017 | Wirtz ............... A61B 5/0051 |

FOREIGN PATENT DOCUMENTS

| | | |
|---|---|---|
| CN | 1813631 A | 8/2006 |
| JP | 11033542 A | 2/1999 |
| KR | 2011058999 A | 6/2011 |
| RU | 2422883 C1 | 6/2011 |

OTHER PUBLICATIONS

Sinkus, R. et al "MR Elastography of Breast Lesions: Understanding the Solid/Liquid Duality can Improve the specificity of Contrast-Enhanced MR Mammography", Magnetic Resonance in Medicine, vol. 58, No. 6, 2007, pp. 1135-1144.

Sinkus, R. et al "High-Resolution Tensor MR Elastography for Breast Tumour Detection", Physics in Medicine and Biology, vol. 45, No. 6, 2000 pp. 1649-1664.

"Piezoelectric Bending Elements for use as Motion Actuators in MR Elastography" Rossman P. et al Proc. Intl. Soc. Mag. Reson. Med. 11 (2003) p. 1075.

Li, J. et al "Image Correction during Large and Rapid B0 Variations in an open MRI System with Permanent Magnetics using Navigator Echoes and Phase Compensation", Magnetic Resonance Imaging, vol. 27, No. 7, 2009, pp. 988-993.

Guivan, M.M. et al "Water Sterilization using a DBD-Driven Xenon Iodide Excilamp", IEEE 2009.

Sinkus, R. et al "High-Resolution Tensor MR Elastography for Breast Tumour Detection", Physics in Medicine and Biology, vol. 45, No. 6, 2000, Abstract Only.

Sinkus, R. et al "MR Elastography of Breast Lesions: Understanding the Solid/Liquid Duality can Improve the specificity of Contrast-Enhanced MR Mammography", Magnetic Resonance in Medicine, vol. 58, No. 6, 2007, Abstract Only.

* cited by examiner

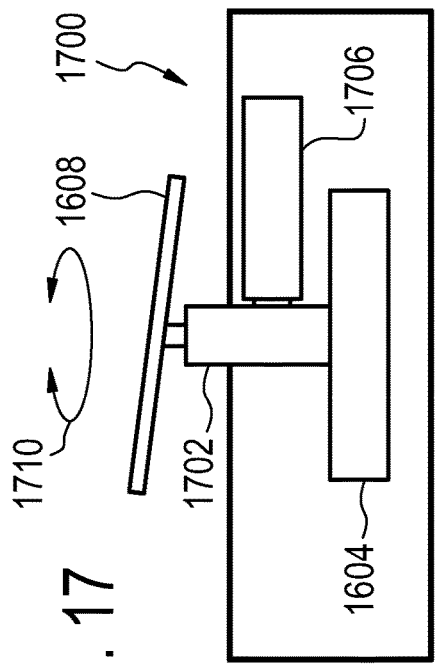
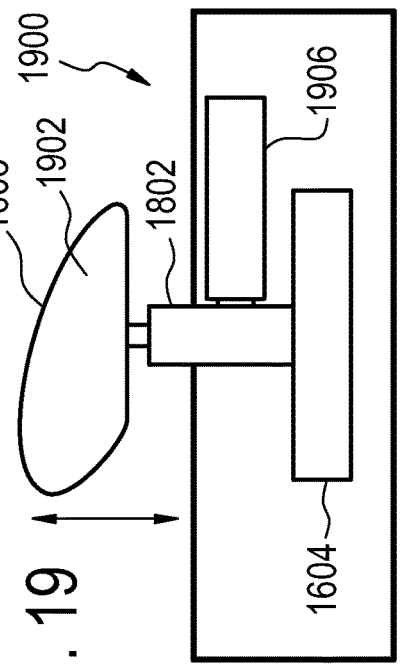
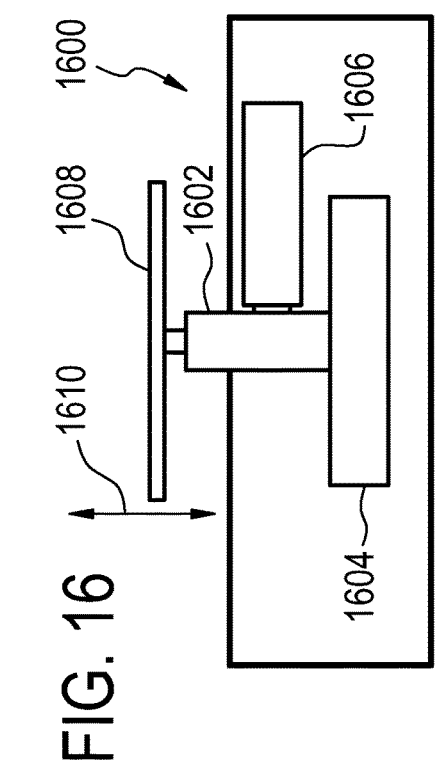
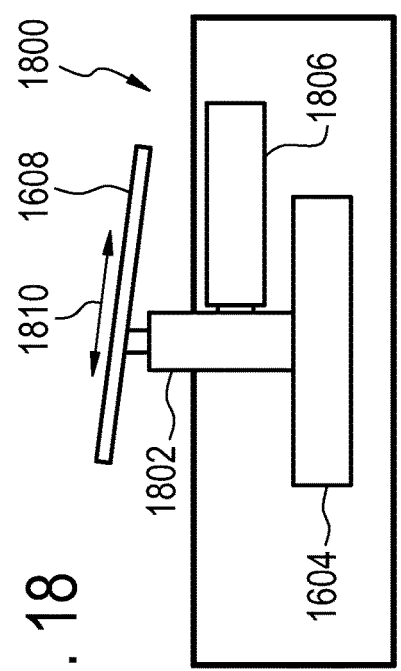

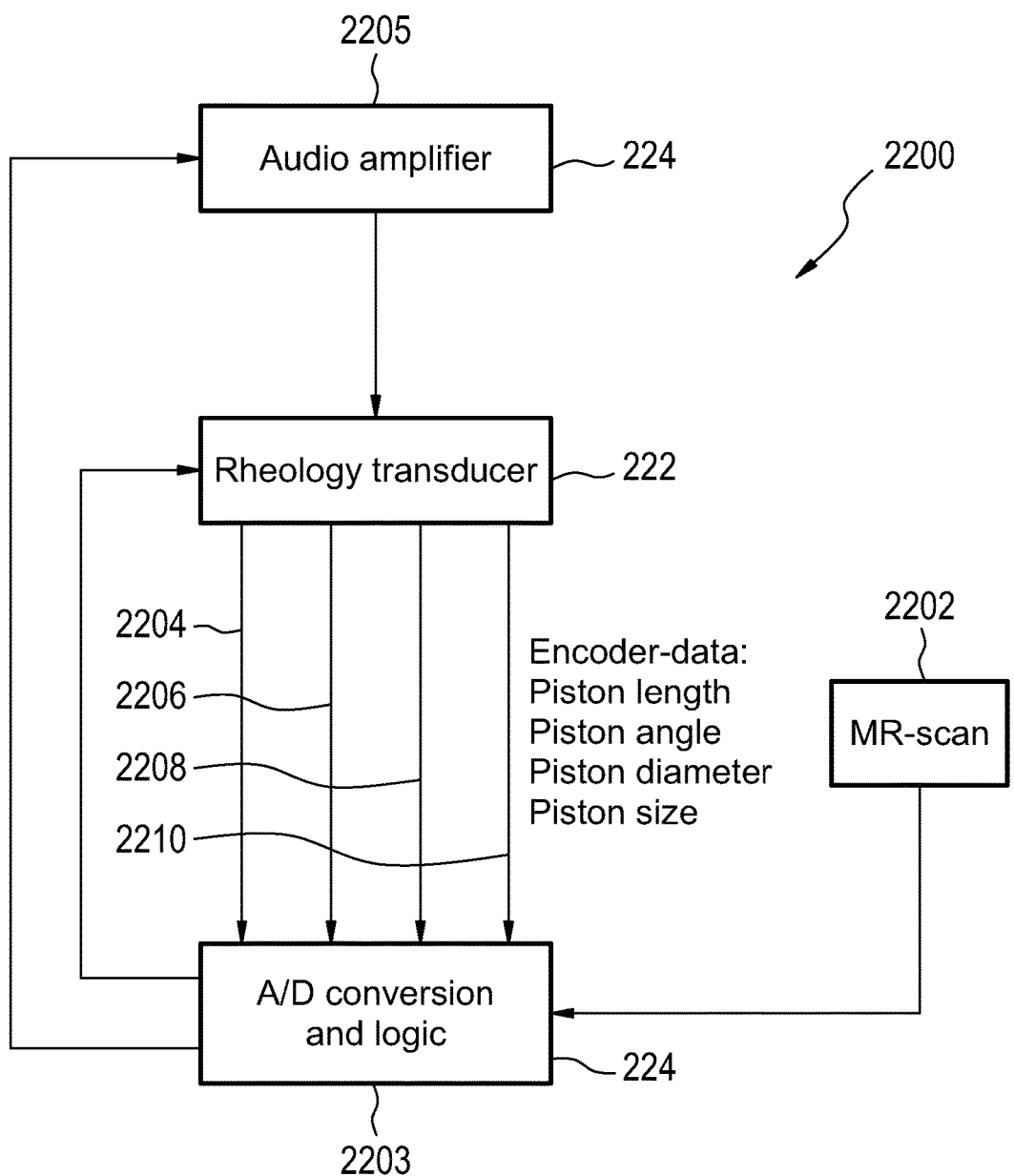

MEASUREMENT OF MAGNETIC RESONANCE RHEOLOGY TRANSDUCER VIBRATIONS USING NAVIGATORS

CROSS-REFERENCE TO PRIOR APPLICATIONS

This application is the U.S. National Phase application under 35 U.S.C. § 371 of International Application No. PCT/EP2013/068626, filed on Sep. 9, 2013, which claims the benefit of U.S. Provisional Patent Application No. 61/699,409 and European Patent Application No. 12183890.8, both of which were filed on Sep. 11, 2012. These applications are hereby incorporated by reference herein.

TECHNICAL FIELD OF THE INVENTION

The invention relates to magnetic resonance rheology, in particular to the use of navigators to measure data descriptive of transducer vibration.

BACKGROUND OF THE INVENTION

Magnetic resonance rheology is an imaging method in which magnet resonance tomography is used to characterize the mechanical properties of tissue. For this purpose, tissue is driven to oscillate mechanically during imaging, leading to certain effects which cause an imaging contrast. Low-frequency mechanical waves are coupled into the tissue and visualized via a magnetic resonance sequence which is phase-locked to the mechanical excitation. Palpation has turned into the assessment of an objective absolute physical quantity, whose diagnostic value can be quantified.

This information can be used to distinguish tissue, i.e., healthy, malign, and etc., based on its viscoelastic properties and leads to a substantial rise in specificity, e.g., for cancer diagnosis. A number of different transducers for employing the mechanical oscillation to the tissue have been proposed and demonstrated namely electromagnetic designs, which make use of the B0-field inside the MR scanner. Piezo-driven transducers or pneumatic designs were proposed for clinical application. The US-patent application US2011/025333 discloses a pneumatic driver located remotely from the MRI scanner. The driver produces shear waves in the subject for performing MR elastography.

The oscillation of the tissue is achieved by attaching a mechanical oscillator to the patient close to the imaging region of interest. The oscillator can be based on an electromechanical converter, like an AC current driven coil, oscillating in a static magnetic B0 field. However, it could be based on any other principle which generates mechanical oscillations of tissue in the required manner in a controlled way. (hydrodynamic, piezoelectric, pneumatic, . . . actuators).

By adjusting a proper input signal the oscillator generates the mechanical waves in the body. Today, the magnitude of the oscillation is manually adjusted based on experiences, e.g. by setting the electrical current through the coil of the electromechanical oscillator mentioned. Changes in resistivity of feeding and coil conductor provoke drifts of currents and thus the amplitude of the oscillator. Different heating of the resistive primary and compensation coil leads to misalignment of B0 compensation, which leads to B0 drifts and B0 artifacts.

SUMMARY OF THE INVENTION

The invention provides for a medical instrument and a computer program product in the independent claims. Embodiments are giving in the dependent claims.

While performing magnetic resonance rheology the Rheology setup is typically not linked to the imaging experiment (timing) or fitted to a certain patient (size of the body, coupling between mechanical oscillator and tissue), there is no feedback between oscillator setting, achieved mechanical magnitude, and imaging result. The oscillation is switched manually on before the imaging experiment is started and stopped after the whole sequence of measurements. Embodiments of the invention may address these problems and others by using navigators acquired with spatially encoding pulse sequences to produce data descriptive of the transducer vibration.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins by the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer. A portion of magnetic resonance data may also refer to a "shot." Navigator data is an example of magnetic resonance data, and is typically representative of a subject's location or state of motion.

In one aspect the invention provides for a magnetic resonance imaging system for acquiring magnetic resonance data from and imaging zone. The magnetic resonance imaging system comprises a processor for controlling the magnetic resonance imaging system. The magnetic resonance imaging system further comprises a memory for storing machine-executable instructions for execution by the processor. Execution of the machine-executable instructions causes the processor to repeatedly control the magnetic resonance imaging system to acquire a portion of the magnetic resonance data. Each portion of the magnetic resonance data comprises navigator data. For some magnetic resonance imaging protocols the data may be acquired over a period of minutes. The portion of the magnetic resonance data refers to a portion of magnetic resonance data that is acquired during a complete protocol.

Navigator data as used herein is an example of magnetic resonance data. The navigator data may also be image data and/or data in k-space which is extracted from the portion of the magnetic resonance data. Navigator data as used herein encompasses magnetic resonance data that is indicative of motion of a subject. For instance if a subject is completely stationary internally and externally then the navigator data should not change. If however the subject is moving or is moving internally then the navigator data may be useful for representing or quantifying this motion. In embodiments of the invention the navigator data is also used to deduce at least one parameter descriptive of the vibration of the transducer.

In one aspect the invention provides for a medical instrument comprising a magnetic resonance imaging system for acquiring magnetic resonance data from a subject at least partially within an imaging zone. The medical instrument further comprises a transducer for mechanically vibrating at least a portion of the subject within the imaging zone. The transducer is capable of vibrating with sufficient frequency, phase and amplitude in order to perform magnetic resonance rheology. In magnetic resonance rheology tissues are vibrated at the same time as a spatially encoding pulse sequence is used to spatially encode magnetic spins.

When a phase map is made using the acquired magnetic resonance data the elastic properties of the vibrated region may be deduced. The medical instrument further comprises a transducer controller for controlling amplitude and phase of vibrations of the transducer. The medical instrument further comprises a processor for controlling the medical instrument. The medical instrument further comprises a memory for storing machine-executable instructions for execution by the processor. Execution of the machine-executable instructions causes the processor to control the transducer controller such that the transducer is induced to vibrate.

Execution of the instructions further cause the processor to control the magnetic resonance imaging system to repeatedly acquire the magnetic resonance data from a first region of interest using a first spatially encoding pulse sequence during vibration of the transducer. Execution of the instructions further cause the processor to control the magnetic resonance imaging system to acquire navigator data from a second region of interest using the second spatially encoding pulse sequence. Execution of the instructions causes the acquisition of the magnetic resonance data to be interleaved with the acquisition of the navigator data. Execution of the instructions further cause the processor to construct a set of navigator profiles using the navigator data. The navigator profiles are data which are descriptive of the motion of the subject which is vibrated by the transducer.

Execution of the instructions further causes the processor to determine at least one parameter descriptive of transducer vibrations using the set of navigator profiles. Execution of the instructions further causes the processor to reconstruct at least one magnetic resonance rheology image from the magnetic resonance data. It is understood that navigator data as used herein encompasses magnetic resonance data. The second spatially encoding pulse sequence may specify a second region of interest. In some embodiments the second region of interest may be the same size or smaller than the first region of interest. The second spatially encoding pulse sequence may also be designed such that it acquires the navigator data much more rapidly than the magnetic resonance data.

Embodiments of the invention may have the advantage that the at least one parameter descriptive of the transducer may be acquired rapidly in comparison to the acquisition of the magnetic resonance data. This may for instance be used for a variety of purposes such as active control of the transducer or detecting if the transducer is functioning properly.

The navigator data may also be considered to be acquired repeatedly. In some embodiments the at least one parameter may be a parameter descriptive of the vibration amplitude and/or phase of the transducer. A navigator as used herein encompasses magnetic resonance data which is acquired to determine spatial or movement information descriptive of a subject.

In some embodiments the transducer vibrates well in contact with the subject. In some embodiments the navigator profile may be reconstructed during the acquisition of the magnetic resonance data. In some embodiments the set of navigator profiles may just have one navigator profile.

The transducer may be implemented in a variety of different ways. For instance the transducer may be constructed using a coil and it may use the magnetic field of the magnetic resonance imaging system in conjunction with the coil to produce the vibrating effect. In other embodiments pneumatic, liquid actuated and piezoelectric transducers may also be used for performing the mechanical vibrating.

In some embodiments the navigator profiles may be constructed in k-space. In other embodiments the navigator profiles may be constructed from images reconstructed from the navigator data.

In another embodiment execution of the instructions further causes the processor to detect periodic contrast variations in the set of navigator profiles. Execution of the instructions further causes the processor to determine the at least one parameter at least partially for performing any one of the following: determining a transducer amplitude using the periodic contrast variations, determining a transducer phase by determining a distance between periodic contrast variations, and combinations thereof. This analysis may be performed in k-space or it may be performed in the reconstructed images. This embodiment may be beneficial because it may have the advantage of being able to rapidly determine the amplitude and/or phase of vibrations induced in the subject.

In another embodiment the medical instrument further comprises a display. Execution of the instructions further causes the processor to display the at least one parameter on the display during acquisition of the magnetic resonance data. Execution of the instructions further cause the processor to display a user interface object on the display. Execution of the instructions further cause the processor to receive a transducer adjustment command from the user interface object. Execution of the instructions further cause the processor to generate a vibration modification control command using the transducer adjustment command. Execution of the instructions further cause the processor to adjust the vibration of the transducer using the transducer control and the vibration modification control. That is to say that the value of the at least one parameter may be displayed on a graphical user interface for a subject or operator and the operator may use the graphical user interface to adjust the level of the amplitude and/or phase of the vibrations. The processor generates the vibration modification control which is then sent to the controller which causes it to change the amplitude and/or phase of the vibrations of the transducer.

In another embodiment the medical instrument further comprises a vibration sensor for acquiring sensor data. Execution of the instructions further causes the processor to acquire sensor data during the vibration of the transducer. The at least one parameter is partially determined using the sensor data. This embodiment may be beneficial because an external sensor may be used to supplement the navigator data to determine the at least one parameter.

In another embodiment the vibration sensor is any one of the following: mounted on the transducer and operable for being mounted on the surface of the subject. Being mounted on the transducer may be an advantage because it may take direct measurements of how the transducer is vibrating mechanically. For instance if the transducer functions by using a coil and the magnetic field of the magnetic resonance imaging system slight changes in alignment may modify the phase and/or amplitude of the transducer. Mounting the sensor directly on the transducer would give a direct feedback. Mounting the vibration sensor directly on the surface of the subject may be useful in several different ways. For instance it may provide a direct measurement if the transducer is even in contact with the subject. For instance during the procedure the transducer may fall off and it may not be detected immediately.

In another embodiment the vibration sensor is any one of the following: an accelerometer, a strain gauge, a pressure gauge, a piezoelectric transducer, a microphone, and combinations thereof.

In another embodiment the transducer comprises at least magnetic sensor for measuring magnetic sensor data. Execution of the instructions further comprises determining the at least one parameter at least partially using the magnetic sensor data. The magnetic sensor data may for instance be descriptive of the absolute magnitude of the magnetic field, the direction of the magnetic field, or the change in the magnetic field. This may be beneficial for the transducer to properly function in the magnetic field particularly if it is the embodiment where a coil is used. In some embodiments the magnetic sensor is a hall effect sensor. This may provide absolute measurements. In other embodiments the magnetic sensor may be a pick up coil which provides information on relative movement of the transducer only.

In another embodiment the magnetic resonance imaging system comprises a main magnet. The main magnet is operable for generating a B0 magnetic field. Determining the at least one parameter at least partially using the magnetic sensor data comprises determining a transducer orientation relative to the B0 field. This is essentially determines a sensor orientation relative to the magnetic field but as the sensor is most likely mounted to the transducer the relation of the transducer orientation to the sensor is known. This may provide for a more consistent operation of the transducer particularly when the transducer is driven using a coil.

In another embodiment the magnetic resonance imaging system further comprises an alignment display. Execution of the instructions further cause the processor to display the sensor orientation relative to the B0 field on the alignment display during acquisition of the magnetic resonance data. This may for instance be an image displayed on a graphical user interface of a display. Or it may also comprise lights or other indicators in the vicinity of the magnetic resonance imaging system such that an operator or other medical professional can properly align the transducer relative to the B0 field.

In another embodiment the medical instrument further comprises an adjustable piston. The adjustable piston comprises a contact surface. The adjustable piston is operable for transmitting the vibration between the transducer and the contact surface. The adjustable piston is operable for being controlled by the processor. Execution of the instructions causes the processor to adjust the adjustable piston in accordance with the at least one parameter. This embodiment may be beneficial because the at least one parameter may be used to adjust the adjustable piston such that the transfer of vibrations from the transducer to the subject is more efficient.

In another embodiment the contact surface is operable for being inflated and deflated. The processor is operable for controlling the inflation and deflation of the inflatable contact surface. The inflatable contact surface may be formed as the surface of an inflatable transducer head or transducer tip. This embodiment may be beneficial because it may control the coupling between the transducer and the subject.

In another embodiment the adjustable piston is operable for adjusting the distance between the transducer and the contact surface. The processor is operable for controlling the distance between the transducer and the contact surface. This may be beneficial for properly adjusting the coupling between the subject and the transducer.

In another embodiment the contact surface is operable for adjusting an angle between the adjustable piston and the contact surface. The processor is operable for controlling the angle between the transducer and the contact surface. This may be beneficial because particularly if the transducer is a coil type which uses the B0 field for driving it, the angle between the transducer and the B0 field is critical. By enabling the adjustment of the angle between the adjustable piston and the contact surface this provides more freedom for coupling the transducer to the subject efficiently.

In another embodiment the contact surface has an adjustable surface area. The processor is operable for controlling the adjustable surface area. For instance the contact surface may be two plates which slide past each other and have their spacing controlled by a mechanism of some sort. For instance fluid, air or small motor may be used to change the spacing between the plates. This may be beneficial because it may be used to affect the area or size of the area which is vibrated on the subject.

In another aspect the invention provides for a computer program product for execution by a processor controlling the medical instrument. The medical instrument comprises a magnetic resonance imaging system for acquiring magnetic resonance data from the subject at least partially within an imaging zone. The medical instrument further comprises a transducer for mechanically vibrating at least a portion of the subject within the imaging zone. The medical instrument further comprises a transducer controller for controlling the amplitude phase of vibrations of the transducer. Execution of the instructions causes the processor to control the transducer to vibrate. Execution of the instructions further causes the processor to control the magnetic resonance imaging system to repeatedly acquire the magnetic resonance data from a first region of interest using a first spatially encoding pulse sequence during vibration of the transducer.

Execution of the instructions further cause the processor to control the magnetic resonance imaging system to acquire navigator data from a second region of interest using a second spatially encoding pulse sequence. The execution of the instructions further causes the acquisition of the magnetic resonance data to be interleaved with the acquisition of the navigator data. Execution of the instructions further cause the processor to construct a set of navigator profiles using the navigator data. Execution of the instructions further causes the processor to determine at least one parameter descriptive of the transducer using the set of navigator profiles. Execution of the instructions further causes the processor to reconstruct at least one magnetic resonance rheology image from the magnetic resonance data.

In another aspect the invention provides for a method of controlling a medical instrument. The medical instrument comprises a magnetic resonance imaging system for acquiring magnetic resonance data from the subject at least partially within an imaging zone. The medical instrument further comprises a transducer for mechanically vibrating at least a portion of the subject within the imaging zone. The medical instrument further comprises a transducer controller for controlling the amplitude, frequency phase of vibrations of the transducer. The method comprises the step of controlling the transducer to vibrate. The method further comprises the step of controlling the magnetic resonance imaging system to repeatedly acquire the magnetic resonance data from a first region of interest using a first spatially encoding pulse sequence during vibration of the transducer.

The method further comprises the step of controlling the magnetic resonance imaging system to acquire navigator data from a second region of interest using a second spatially encoding pulse sequence. The magnetic resonance data acquired is interleaved with the acquisition of the navigator data. The method further comprises constructing a set of navigator profiles using the navigator data. The method further comprises determining at least one parameter descriptive of the transducer using the set of navigator profiles. The method further comprises reconstructing at least one magnetic resonance rheology image from the magnetic resonance data.

It is understood that one or more claims and/or one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which:

FIG. 16 illustrates a transducer according to an embodiment of the invention;

FIG. 17 illustrates a transducer according to a further embodiment of the invention;

FIG. 18 illustrates a transducer according to a further embodiment of the invention;

FIG. 19 illustrates a transducer according to a further embodiment of the invention;

FIG. 22 shows an example of a control loop 2200 for automatically configuring the performance of a transducer.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
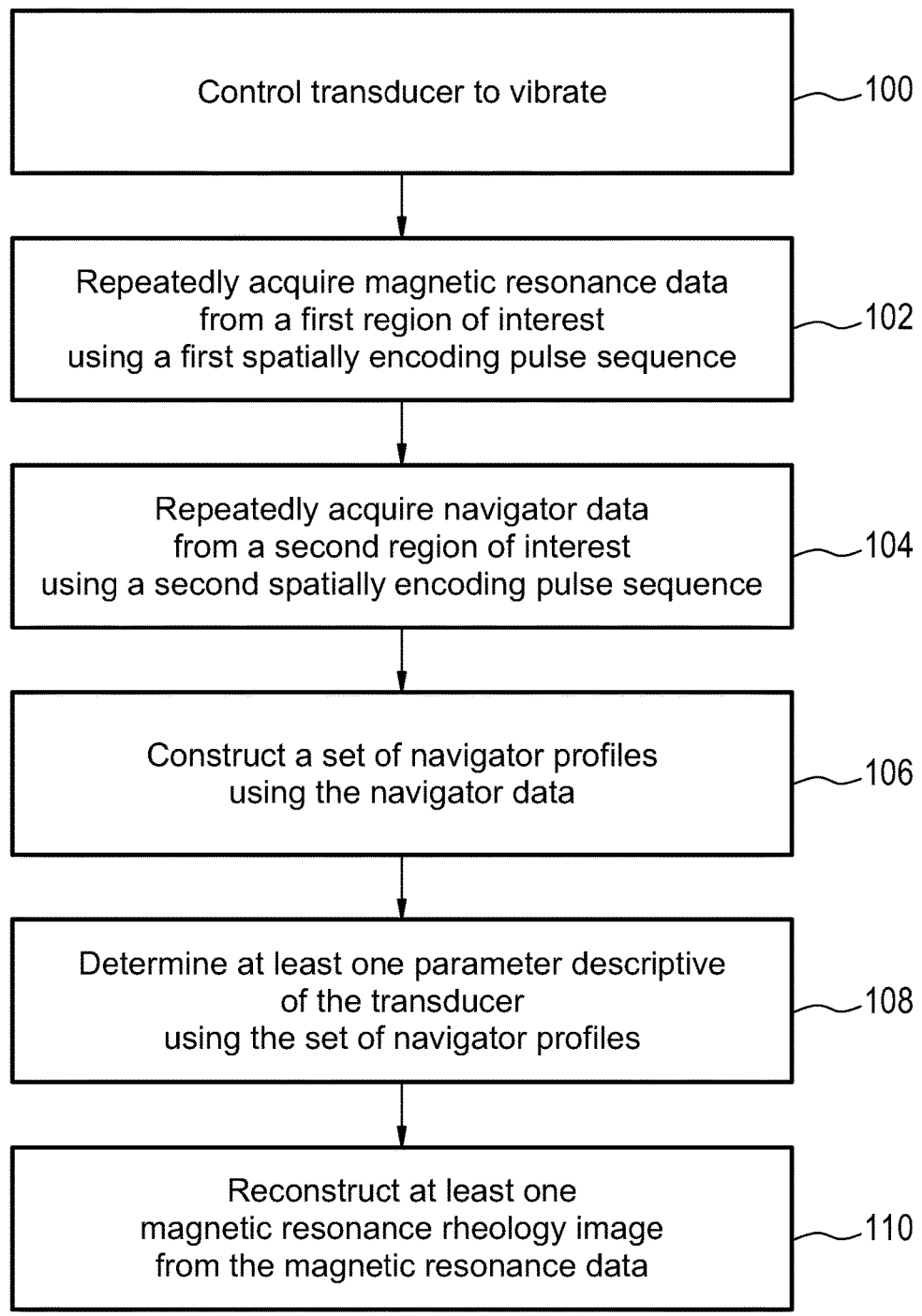
FIG. 1 shows a flow diagram which illustrates a method according to an embodiment of the invention.

FIG. 1 shows a flow diagram which illustrates a method according to an embodiment of the invention. In step 1 a transducer or the transducer controller is controlled to cause the transducer to vibrate. Next in step 102 magnetic resonance data is repeatedly acquired from a first region of interest using a first spatially encoding pulse sequence. Next in step 104 navigator data is repeatedly acquired from a second region of interest using a second spatially encoding pulse sequence. The magnetic resonance data and the navigator data are acquired in an interleaved fashion. As such steps 102 and steps 104 are repeated many times and the exact order in this flow diagram is not relevant. Next in step 106 a set of navigator profiles is constructed using the navigator data. Next in step 108 at least one parameter is determined using the set of navigator profiles which is descriptive of the transducer. And finally in step 110 at least one magnetic resonance rheology image is reconstructed from the magnetic resonance data.

Figure 2:
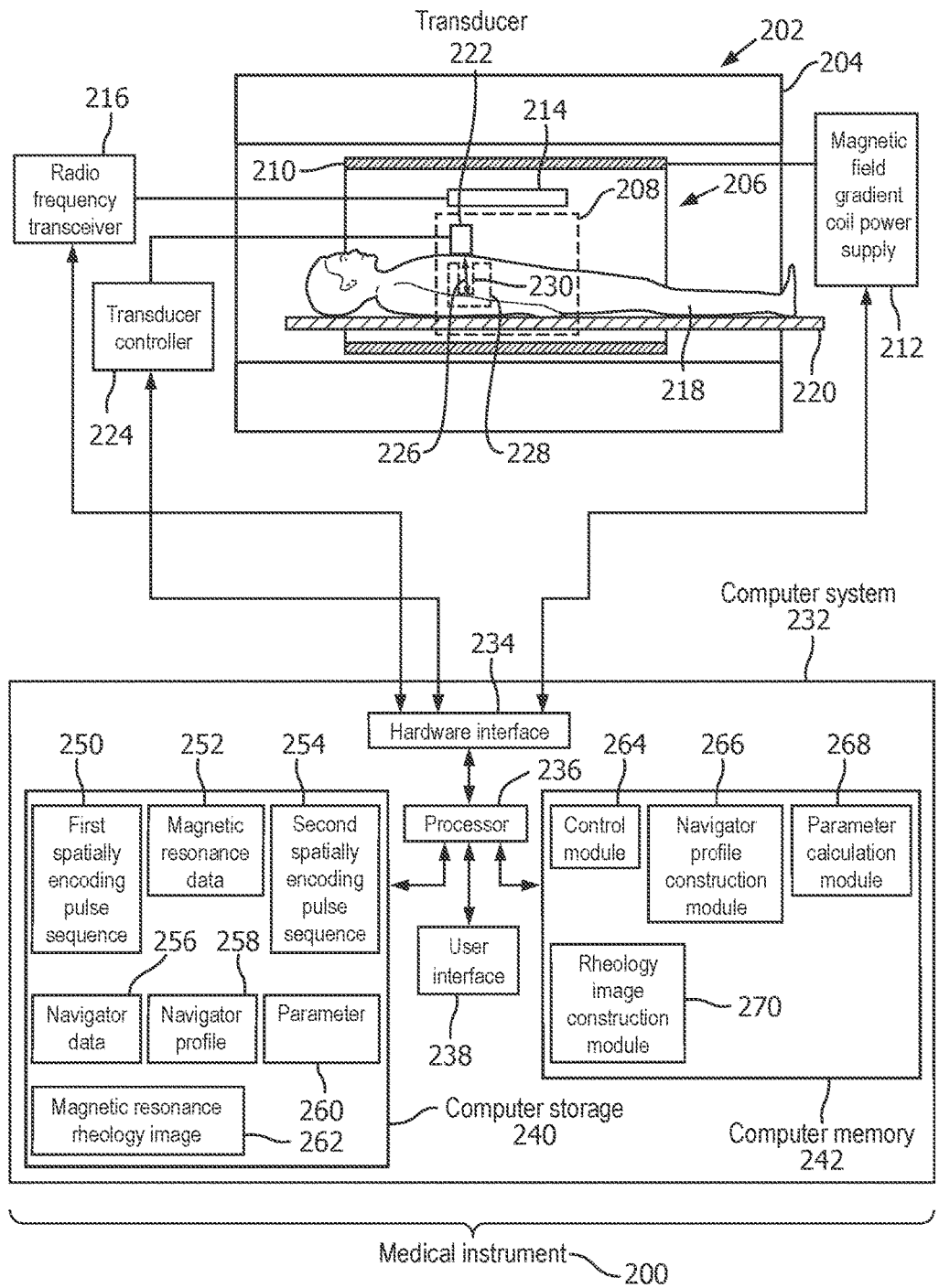
FIG. 2 illustrates an example of a medical instrument according to an embodiment of the invention.

FIG. 2 illustrates an example of a medical instrument 200 according to an embodiment of the invention. The medical instrument 200 comprises a magnetic resonance imaging system 202 comprises a magnet 204. The magnet 204 is a superconducting cylindrical type magnet 204 with a bore 206 through it. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 206 of the cylindrical magnet 204 there is an imaging zone 208 where the magnetic field is strong and uniform enough to perform magnetic resonance imaging.

Within the bore 206 of the magnet there is also a set of magnetic field gradient coils 210 which is used for acquisition of magnetic resonance data to spatially encode magnetic spins within the imaging zone 208 of the magnet 204. The magnetic field gradient coils 210 connected to a magnetic field gradient coil power supply 212. The magnetic field gradient coils 210 are intended to be representative. Typically magnetic field gradient coils 210 contain three separate sets of coils for spatially encoding in three orthogonal spatial directions. A magnetic field gradient power supply supplies current to the magnetic field gradient coils. The current supplied to the magnetic field gradient coils 210 is controlled as a function of time and may be ramped or pulsed.

Adjacent to the imaging zone 208 is a radio-frequency coil 214 for manipulating the orientations of magnetic spins within the imaging zone 208 and for receiving radio transmissions from spins also within the imaging zone 208. The radio frequency antenna may contain multiple coil elements. The radio frequency antenna may also be referred to as a channel or antenna. The radio-frequency coil 214 is connected to a radio frequency transceiver 216. The radio-frequency coil 214 and radio frequency transceiver 216 may be replaced by separate transmit and receive coils and a separate transmitter and receiver. It is understood that the radio-frequency coil 214 and the radio frequency transceiver 216 are representative. The radio-frequency coil 214 is intended to also represent a dedicated transmit antenna and a dedicated receive antenna. Likewise the transceiver 216 may also represent a separate transmitter and receivers.

A transducer 222 is shown as being mounted on a surface of the subject 218. Transducer 222 is connected to a transducer controller 224 which provides energy for actuating the transducer 222. The transducer 222 induces vibrations in the subject 218. The arrow 226 shows the direction of vibrations induced in the subject 218. The transducer 222 and the arrow 226 are intended to be representative. In some embodiments the transducer and the arrow 226 are preferably aligned with the magnetic field of the magnet 204 because the transducer 222 uses the magnetic field in conjunction with the coil to cause the vibrations. However the transducer 222 and the transducer controller 224 are representative and may represent a variety of different types of transducers 222 and transducer controllers 224.

For instance the transducers may represent a coil system, a pneumatic system, liquid actuated system, and a piezo-electric transducer. Shown within the imaging zone 208 is a first region of interest 228 and a second region of interest 230. The first region of interest 228 is a region where magnetic resonance data is acquired from. The second region of interest 230 is a region of interest where the navigator data is acquired from. In this embodiment the second region of interest 230 is a subset of the first region of interest 228. However in some embodiments they may be disjoined or partially disjoined. In this embodiment the second region of interest 230 is aligned with the arrow 226 to capture the vibration motion caused by the transducer 222.

It should be noted that the regions of interest define a region within the imaging zone 208. However the boundary of the region of interest is not necessarily that clean or well defined. The magnetic resonance data or navigator data is acquired in Fourier space and therefore contains contributions from outside of the first region of interest 228 and the second region of interest 230.

The magnetic field gradient coil power supply 212, the transceiver 216, and the transducer controller 224 are connected to a hardware interface 234 of computer system 232. The computer system 243 further comprises a processor 236. The processor 236 is connected to the hardware interface 234, a user interface 238, computer storage 240, and computer memory 242.

The computer storage 240 is shown as containing a first spatially encoding pulse sequence 250. The first spatially encoding pulse sequence 250 was used to control the magnetic resonance imaging system 200 to acquire the magnetic resonance data 252. The computer storage 240 is shown as containing a second spatially encoding pulse sequence 254. The second spatially encoding pulse sequence 254 was used by the magnetic resonance imaging system 200 to acquire the navigator data 256 from the second region of interest 230. The computer storage 240 is shown as containing a navigator profile 258. The navigator profile 258 was determined using the navigator data 256. The computer storage 240 is further shown as containing a parameter 260 calculated using the navigator profile 258. The computer storage 240 is further shown as containing a magnetic resonance rheology image 262. The magnetic resonance rheology image 262 was calculated using the magnetic resonance data 252.

The computer memory 242 is shown as containing a control module 264. The control module contains computer-executable code which enables the processor to control the operation and function of the medical instrument 200. For instance the control module 264 may use the pulse sequences 250, 254 to acquire the magnetic resonance data 252 and the navigator data 256. The computer memory 242 is shown as further containing a navigator profile construction module 266. The navigator profile construction module 266 contains computer-executable code which enables the processor 236 to reconstruct the navigator profile 258 from the navigator data 256. The computer memory 242 is shown as further containing a parameter calculation module 268. The parameter calculation module 268 contains computer-executable code which enables the processor 236 to calculate the parameter 260 from the navigator profile 258. The computer memory 242 is shown as further containing a rheology image construction module 270. The rheology image construction module 270 contains computer-executable code which enables the processor 236 to reconstruct the magnetic resonance rheology image 262 from the magnetic resonance data 252.

Figure 3:
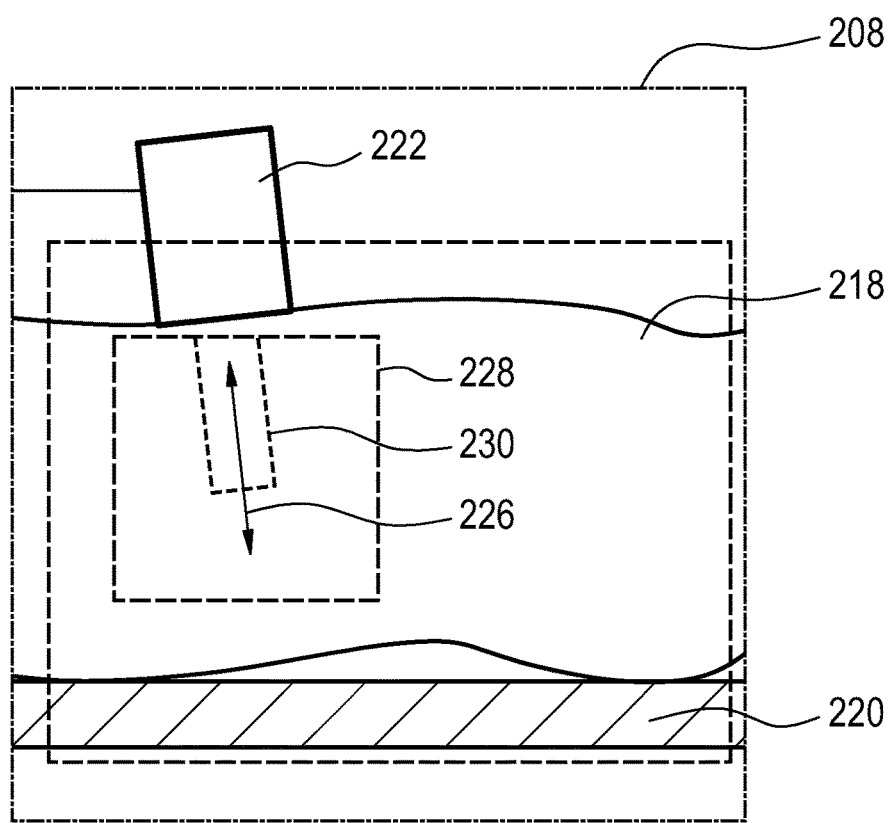
FIG. 3 shows a detailed view of the imaging zone illustrated in FIG. 2.

FIG. 3 shows a detailed view of the imaging zone 208 of FIG. 2.

Figure 4:
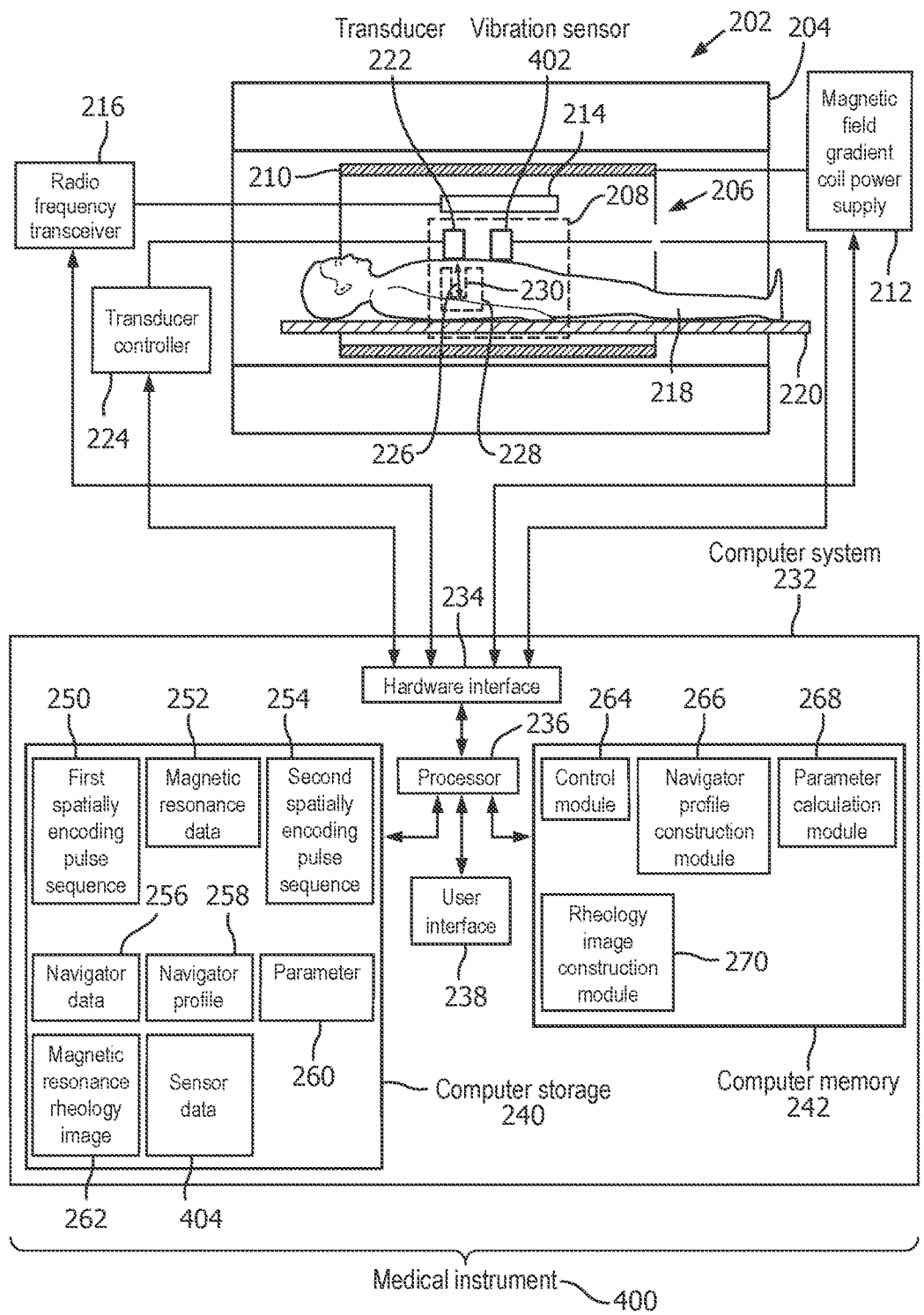
FIG. 4 shows a medical instrument according to a further embodiment of the invention.

FIG. 4 shows a medical instrument 400 according to a further embodiment of the invention. The medical instrument in FIG. 4 is similar to that shown in FIGS. 2 and 3 except this medical instrument 400 additionally has a vibration sensor 402. The vibration sensor 402 is intended to be representative. It is shown in contact with the surface of the subject 218, however in some embodiments the vibration sensor 402 may be in contact with the transducer 222. The vibration sensor 402 is also intended to be representative of different types of vibration sensors. For instance the vibration sensor may be, but is not limited to: an accelerometer, a strain gauge, a pressure gauge, a piezoelectric transducer, a microphone, or a combination of a variety of these sensors.

Computer storage 240 is further shown as containing sensor data 404 which is acquired by the vibration sensor 402 during acquisition of the magnetic resonance data 252 and/or navigator data 256. In this embodiment the parameter calculation module 268 is additionally operable to enable the processor 236 to also use the sensor data 404 in the calculation of the parameter 260.

Some embodiment of the invention may use a feedback loop to increase Rheology performance, avoiding unnecessary repetition of measurements due to poor quality (e.g. if the current through the Rheology transducer is not optimally set) and to increase patient comfort. Especially, if the size of the patients varies and thus the fat distribution in the body changes from patient to patient, the settings of the Rheology unit for achieving good imaging results have to be adapted. An automatic tuning mechanism based on imaging data and monitored oscillator data may improve its performance.

Embodiments of the invention may measure the oscillation amplitude and frequency of the applicator or the surrounding tissue, as well as the current through the device in case of an electromechanical transducer. Monitoring the applicator performance allows for correcting the input signal of the oscillator with regards to phase, frequency and amplitude. Furthermore, feedback information is generated based on the imaging result. All these pieces of information are combined in a control device for steering the oscillator.

Figure 5:
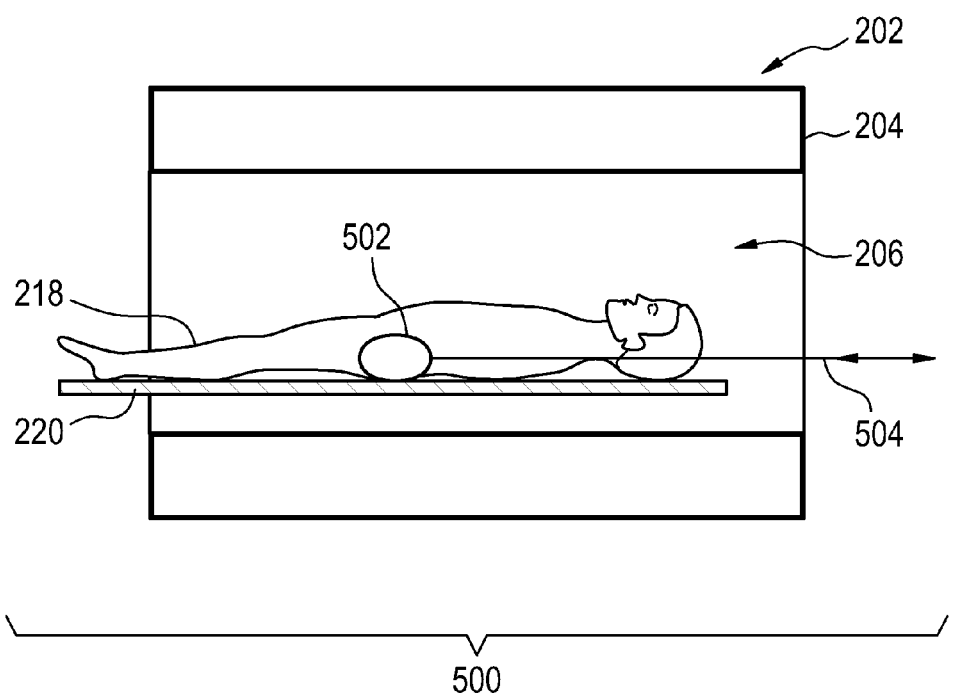
FIG. 5 shows a schematic diagram of a medical apparatus according to a further embodiment of the invention.

FIG. 5 shows a schematic diagram of a medical apparatus 500 according to a further embodiment of the invention. FIG. 5 shows an MRI system with Rheology applicator. Next to a liver setup, other applications like breast or head imaging are known. The embodiment shown in FIG. 5 is similar to that shown in FIGS. 2 and 4. However, not all components are shown in FIG. 5. There is a magnetic resonance imaging system 202 with a subject 218 reposing on a patient table 220. It can be seen that a rheology applicator 502 or transducer is in contact with the subject 218. The rheology applicator 502 is connected with a driving signal and sensing lines 504 which is operable for connecting to a transducer controller which is not shown in this diagram.

Figure 6:
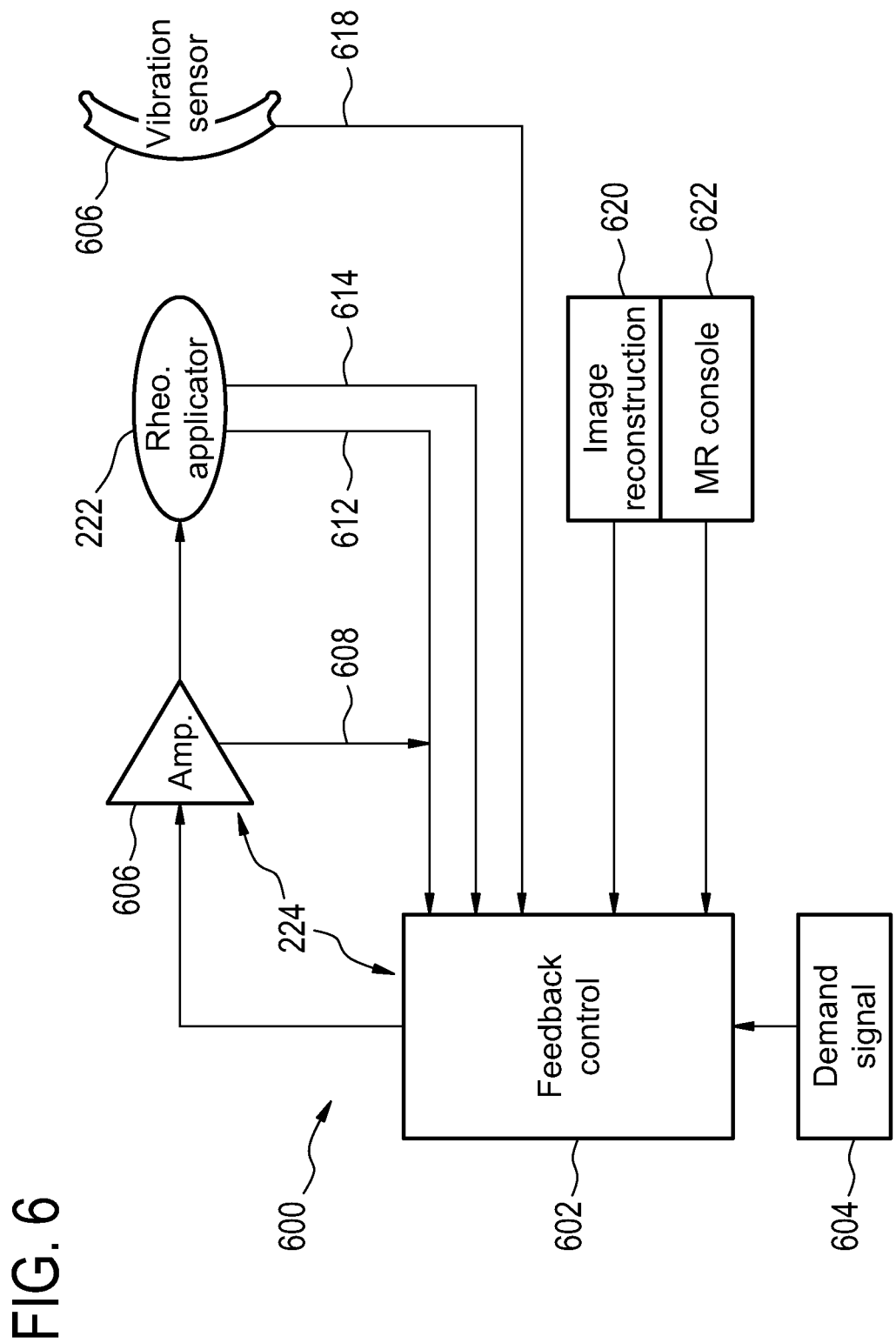
FIG. 6 illustrates an example of a feedback control loop 600.

FIG. 6 illustrates an example of a feedback control loop 600. A feedback controller 602 which controls an amplifier 606 forms one embodiment of the transducer controller 224. This is used for driving a transducer 222. The feedback controller 602 responds to a demand signal 604 for vibrating the transducer 222. The amplifier 606 provides a direct feedback 608 to the feedback controller. The transducer 222 also provides direct feedback 612 which are indirect measurements at the applicator. The transducer 222 also provides direct measurements or direct feedback 614 to the controller 602. The direct measurements are an actual measurement of the mechanical oscillations caused by the transducer 222. The system may also optionally have a vibration sensor 616. The measurements from the vibration sensor are provided as feedback 618 to the feedback control unit 602. The feedback controller can also take feedback from image reconstruction 620 performed on magnetic resonance images and also direct control instructions from the magnetic resonance system console 622 for instance through a graphical user interface that an operator is using to control the magnetic resonance imaging system. The image feedback 620 may be in the form of diagnostic images or may in the form of navigator images or data.

FIG. 6 shows a feedback control loop and feedback input data measurement. Usable data for such a feedback loop may be the oscillation frequency and amplitude, the current through the applicator or the temperature.

As mentioned above, FIG. 6 shows a control loop. The Rheology applicator as central element is driven by an audio frequency amplifier (here: the example of an AC current driven coil). The amplifier input signal is calculated based on a set of values gained by measurements:

Indirect measurement at the applicator: The electric current though the oscillation coil, or at the amplifier Direct measurement at the applicator: measurement of the magnitude of the mechanical oscillation Direct measurement at an additional device: a sensor for mechanical vibration is attached to the patient's tissue, e.g., a girdle with a resistive strain gauge, wrapped around the patient to directly measure the mechanical vibration of tissue, or an acceleration sensor measures mechanical parameters Derived from the image reconstruction/MR console. Based on a first Rheology calibration measurement, image parameters are derived and corresponding results are calculated. Based on these results, the magnitude of the oscillation could be reduced or increased The direct link between MR console and oscillator driving amplifier allows synchronizing imaging sequences and application of mechanical oscillation. Furthermore, real time data of the MRI imaging sequence are used at the input for the feedback control so that the oscillator is only switched on when needed The feedback control loop adjusts the output according to the demand signal within the limits of the devices attached. The whole feedback loop or part of the loop can also be integrated in the transducer setup. Communication between the transducer and MRI system is performed using for example optical or wireless system.

Auto-calibration of feedback loop and preset data for different subjects (weight, fat, imaging data, database) may be implemented in the software, which controls the loop.

Figure 7:
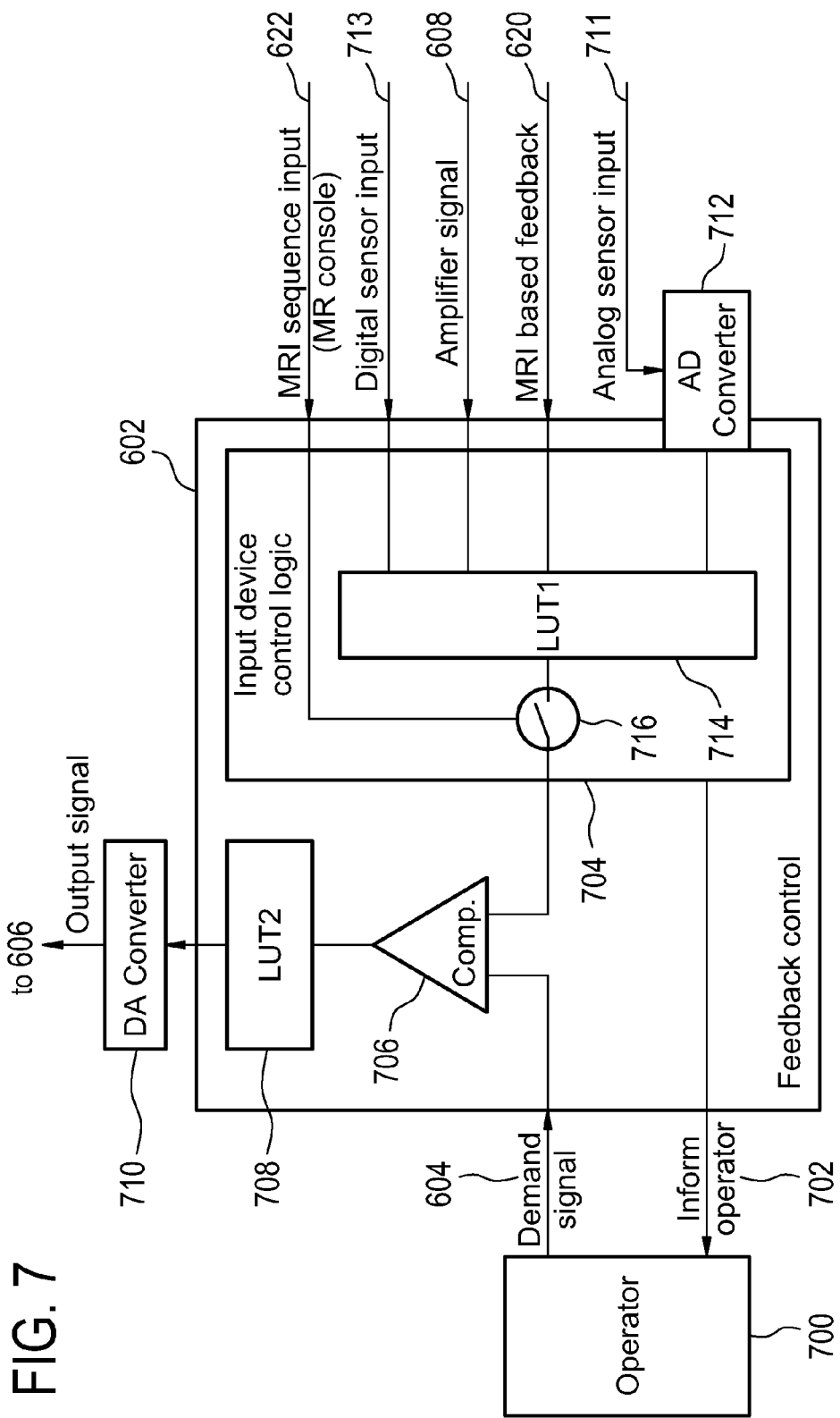
FIG. 7 shows a concrete embodiment of the feedback controller 602.

FIG. 7 shows a concrete embodiment of the feedback controller 602. The feedback controller may for instance be able to receive a demand signal 604 and send a signal to an operator 702. The operator is indicated as component 700. The signal to the operator 702 may come from a control logic 704 device. A comparator 706 may compare the demand signal to a signal from the control object 704. This is then sent to a second lookup table 708. At the output of the second lookup table 708 is a digital-to-analogue converter 710 which provides a signal to the amplifier 606 shown in FIG. 6. The control object portion 704 combines various types of feedback. For instance the magnetic resonance console control 622 may have a switch 716 which is controlled by the magnetic resonance imaging pulse sequence. Various types of other input may also be included. For instance the amplifier signal 608 and the magnetic resonance based feedback 620. There may also be various types of analogue sensor input 711 which go through digital-to-analogue converters 712. There may also be digital sensor input 713. The various types of input are compared against a first lookup table 714. The first lookup table 714 provides the value from the control object 704 to the comparator 706.

FIG. 7 shows a realization of the feedback control device. Demand signal, measured signals, image based information, and MRI sequence input serve as input. It might be required to digitize the measured signals, if the sensor itself does not do the AD conversion. The input device control logic sorts the feedback input signal according to their importance. The MRI sequence input (MR console) has the highest priority: in case no oscillation is required the oscillation is switched off. The MR console can also stop the oscillation in case of a scan interruption by the patient (nurse call) due to an emergency. Second important signal is the MRI based information: It is compared with the demand signal. If a certain effect, e.g. contrast is not reached; the amplifier input signal gets adjusted according to the look-up-table (LUT2). LUT2 results from calibration measurements and knowledge of the system components like: power limit of the amplifier or other devices, and Rheology applicator limits against hurting the patient. The output signal is feed to the amplifier, which probably needs an analogue input signal.

The measured signals of the amplifier (output power coupler), the sensors at the oscillator, or the vibration sensor are of third order importance. They can be used to check the set-up of the device. Example: Missing effects in the measured MR image can result from to low oscillation of the Rheology applicator. Then the amplifier output needs to be increased. However, it can also result from missing mechanical coupling of the Rheology applicator to the tissue. Such a fault can be detected in the input device control logic comparing the sensors at different stages of the chain. Limits an tolerance ranges for the signals originating of the different parts of the chain are stored in LUT1.

The process described is executed once at the beginning of a MRI Rheology measurement, and is repeated continuously during the measurement to compensate for drifts and to check for proper functioning.

The feedback control unit can be a stand-alone device, or it can be part of the operator console, which then has to be extended by additional hard and software.

FIGS. 8-13 illustrate how navigator images and/or data may be used to determine the at least one parameter descriptive of the transducer.

Figure 8:
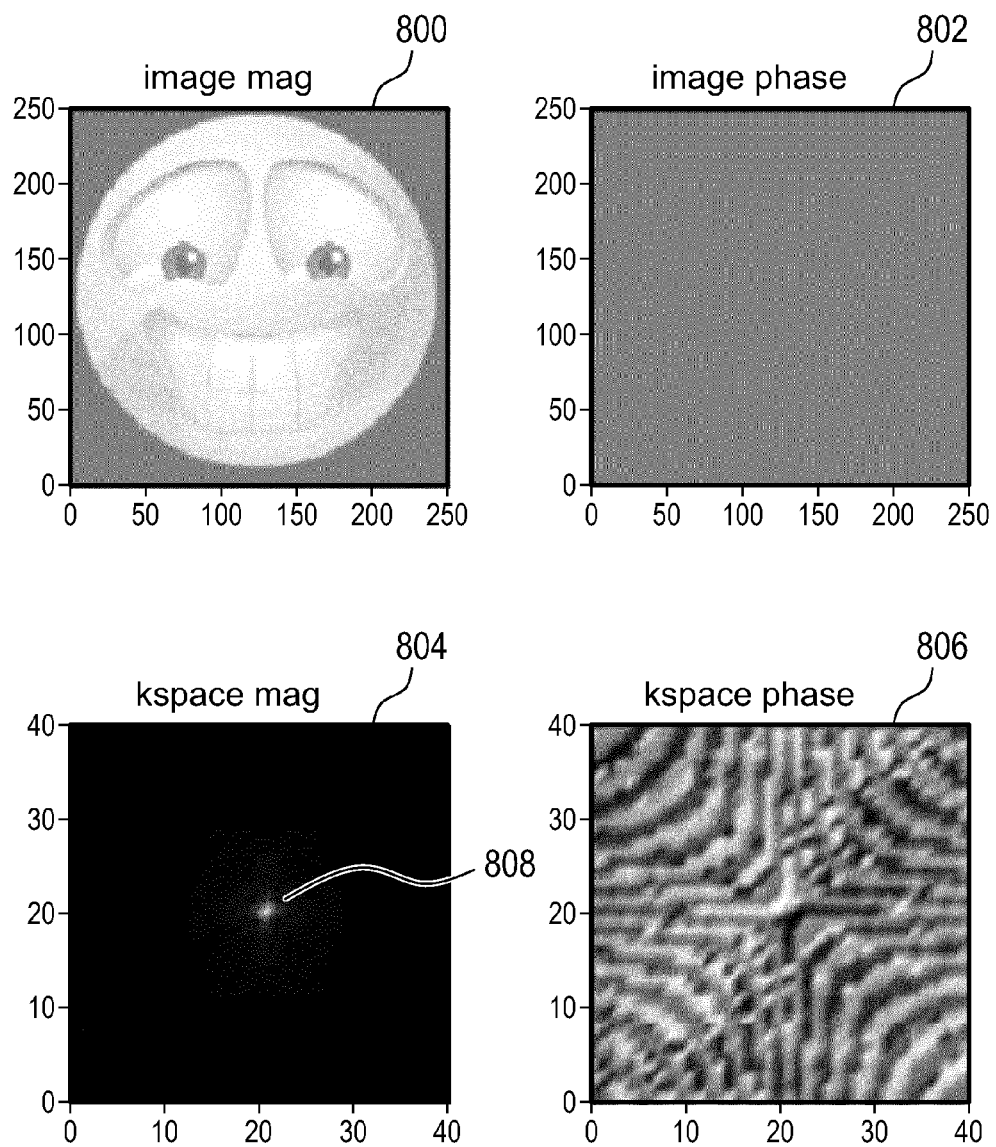
FIG. 8 illustrates how navigator images and/or data may be used to determine the at least one parameter descriptive of the transducer.

FIG. 8 shows a test image 800, 802. The image 800 shows the magnitude of the image 800 and the image 802 indicates the phase of the test image. In this case the test image comprises both a magnitude and a phase. This image 800, 802 is then Fourier transformed. 804 shows the magnitude of the test image in k-space and image 806 shows the phase 806 of the Fourier transformed image. It can be seen that there is a single bright spot 808 present in the k-space magnitude image 804.

Figure 9:
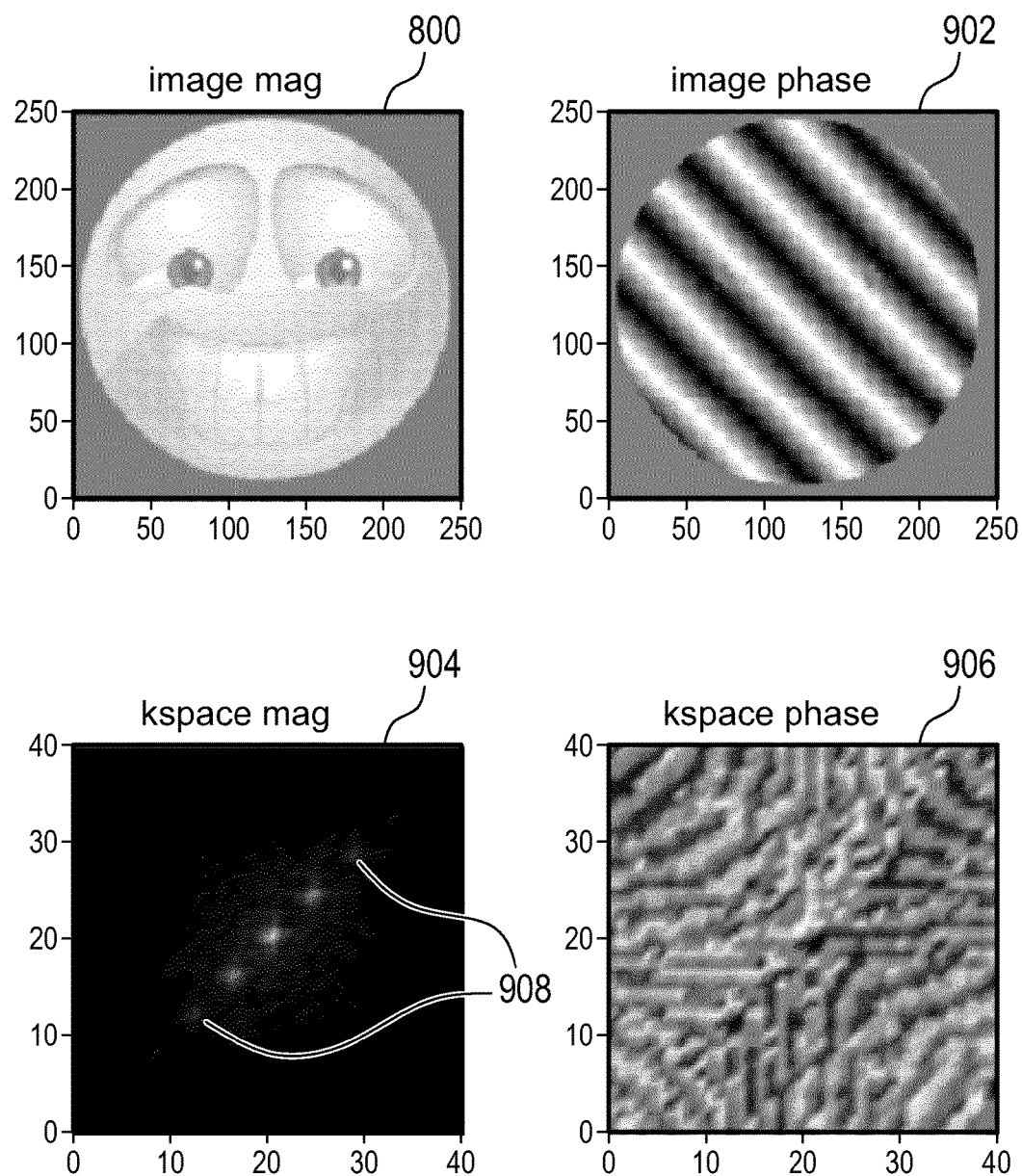
FIG. 9 further illustrates how navigator images and/or data may be used to determine the at least one parameter descriptive of the transducer.

FIG. 9 shows the same magnitude image 800 but in this case a sinusoidal phase has been introduced into the phase image 902. When the Fourier transform is performed it can be seen that the phase image 906 differs from the phase image 806. Of particular significance is the change in the k-space magnitude image 904. In this case it can be seen that there is a series of bright spots 908.

Figure 10:
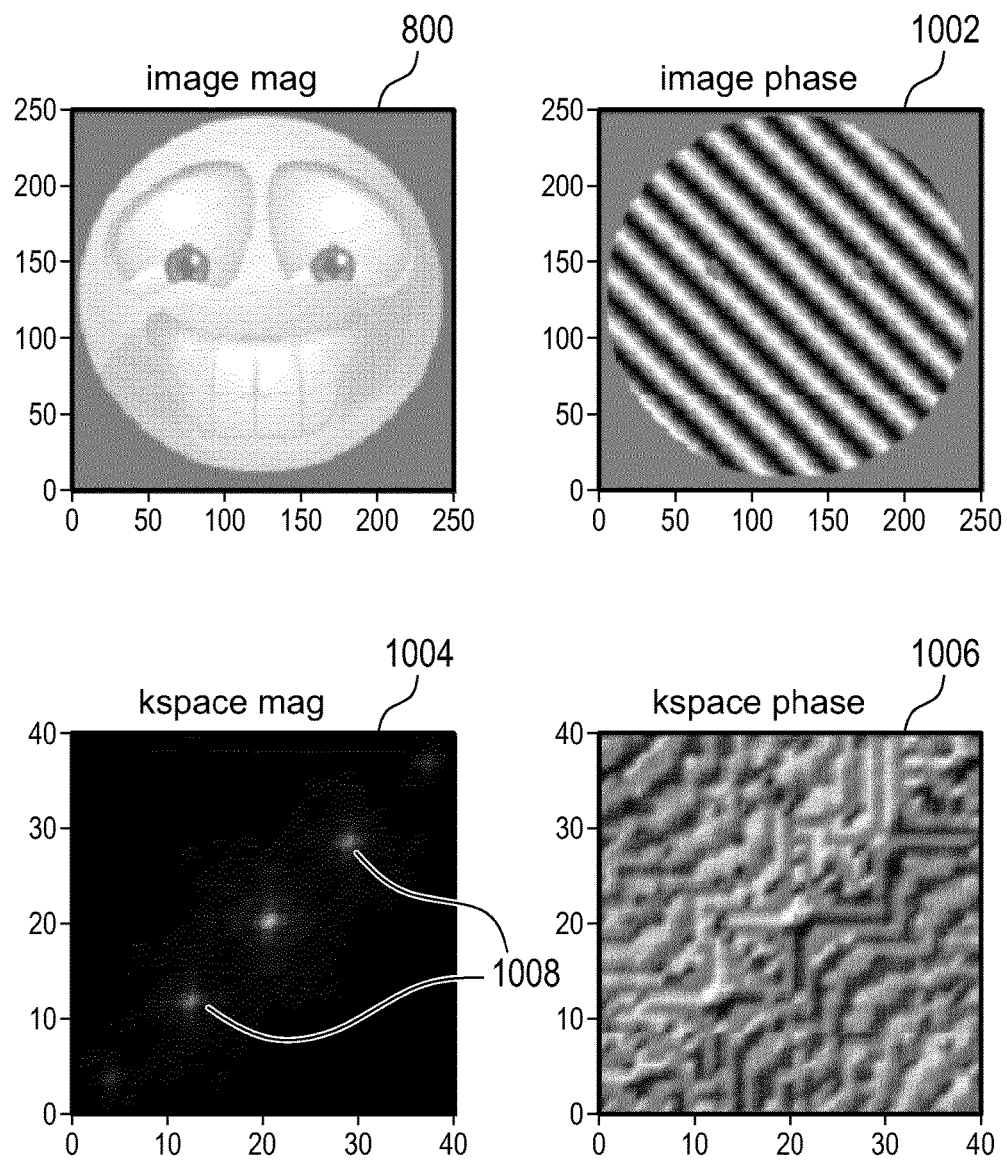
FIG. 10 further illustrates how navigator images and/or data may be used to determine the at least one parameter descriptive of the transducer.

FIG. 10 shows a set of images similar to that shown in FIG. 9 except in this case the phase of test image 1002 has a sinusoidal phase of a higher spatial frequency. It can be seen that the Fourier transformed image 1004, 1006 shows a change in the k-space phase 1006 with respect to the k-space phase of image 906. Of particular significance it can be seen that there are also multiple bright spots 1008 in the k-space magnitude image 1004. However the bright spots 1008 are spaced further apart than the bright spots 908. The magnitude of the spots in k-space may therefore be of particular use in determining the phase and amplitude of the transducer. As the amplitude increases the brightness in the k-space magnitude image will increase. As the spatial frequency increases the bright spots in the k-space magnitude image 1004 will become further apart. This result may be particularly useful because the magnetic resonance data is acquired in k-space. The amplitude and phase of the transducer can be controlled without performing a reconstruction of the image.

Figure 11:
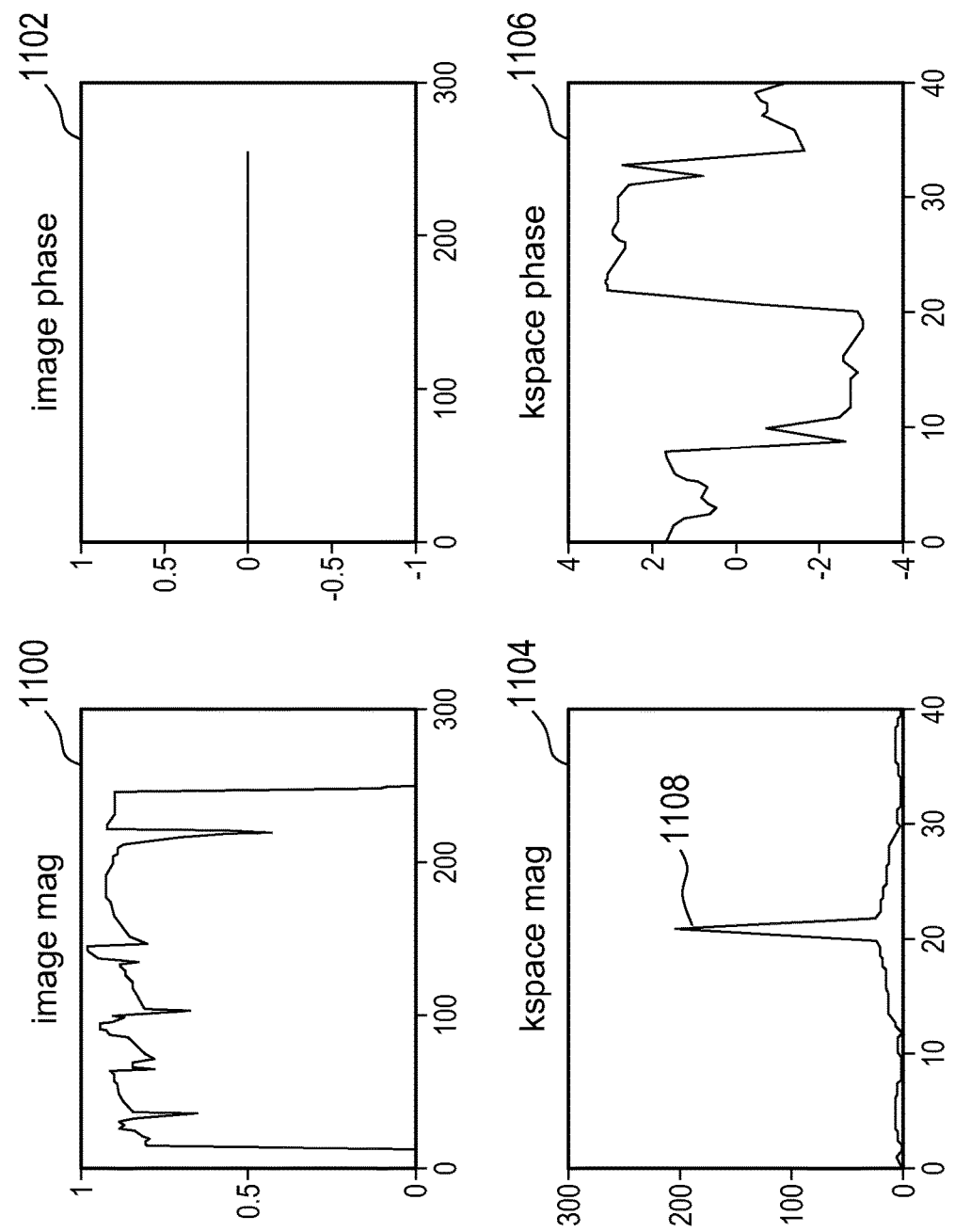
FIG. 11 further illustrates how navigator images and/or data may be used to determine the at least one parameter descriptive of the transducer.
Figure 12:
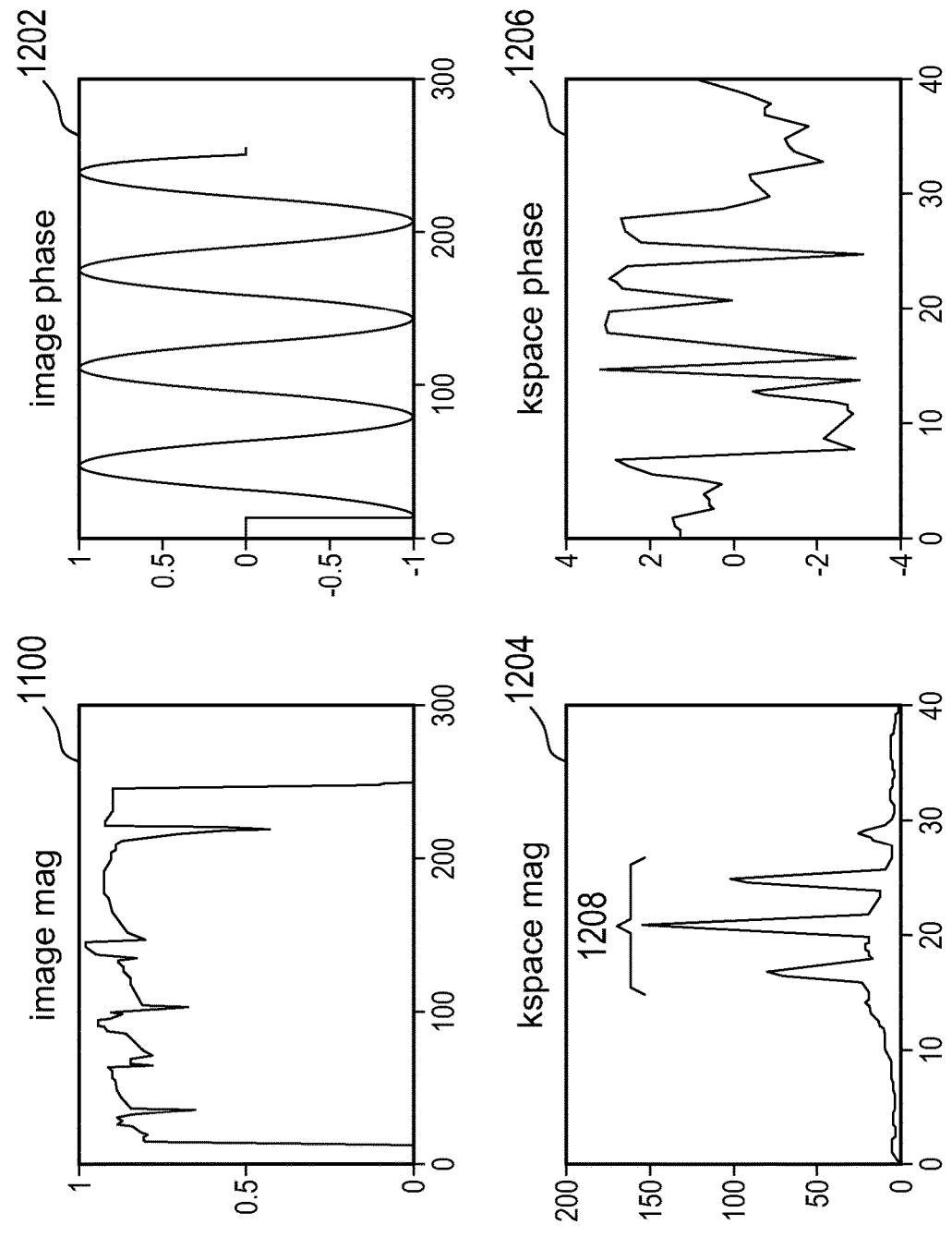
FIG. 12 further illustrates how navigator images and/or data may be used to determine the at least one parameter descriptive of the transducer.
Figure 13:
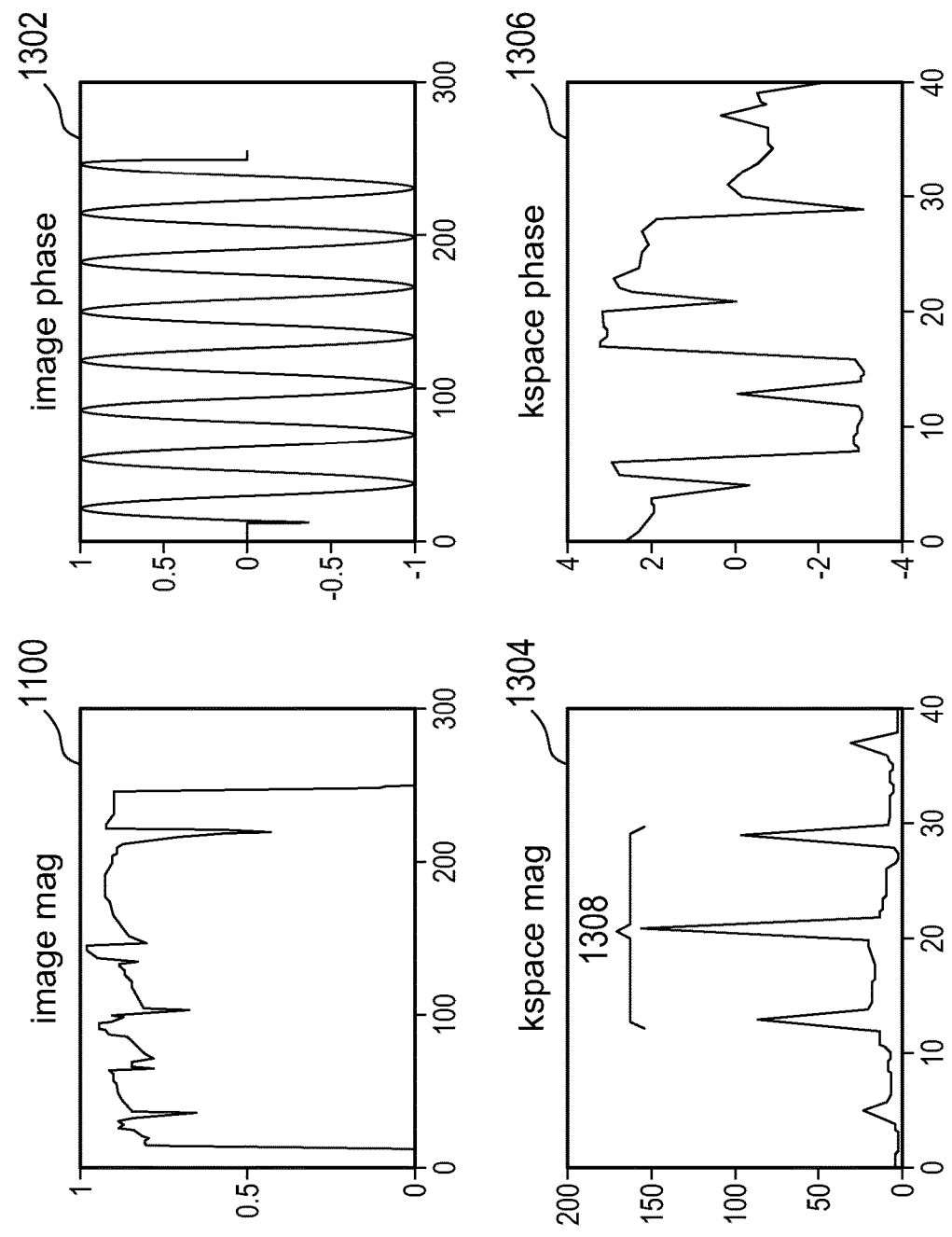
FIG. 13 further illustrates how navigator images and/or data may be used to determine the at least one parameter descriptive of the transducer.

FIGS. 11-13 illustrate how this may be applied even by taking a single line in k-space. FIG. 11 shows four plots. FIG. 1100 shows a cross-section of the image 800 and plot 1102 shows a cross-section of plot 802. Plot 1100 and 1102 these values are then Fourier transformed. The k-space in magnitude is plotted in 1104 and the phase is plotted in 1106. In the k-space magnitude plot 1104 it can be seen that there is a single large peak 1108.

FIG. 12 shows a cross-section of image 800 and a cross-section of image 902, which is plotted in plot 1202. These values are then Fourier transformed. There is a magnitude plot 1204 and a phase plot 1206. In the magnitude plot 1204 there is a minimum of three peaks 1208 visible.

FIG. 13 shows a cross-section of image 800 which is plotted in FIG. 1100 and a cross-section of image 1002 which is plotted in plot 1302. These values are then Fourier transformed the k-space magnitude plot is 1304 and the k-space phase plot is plot 1306. It can be seen that in the magnitude plot 1304 there are again multiple peaks 1308 visible. The spacing of the peaks has however changed. The k-space plots shown in FIGS. 11-13 are representative of the data that would be acquired by acquiring a single line of magnetic resonance data. This illustrates how the amplitude and phase could be determined with a single line of k-space data. This would be an extremely efficient method of controlling the amplitude and phase of the transducer as it would be extremely rapid to acquire and interpret this data.

Typical electrically driven Rheology transducers are operated free running independent of their orientation to the B0 field. When the transducer is tilted away with respect to the z-axis the oscillation amplitude is reduced given a constant current through the device.

We propose the incorporation of one or several Hall Sensors or other field probes for determining the B0 field at the position of the transducer. In case the transducer is tilted with respect to the z-axis or moved radially, the output of the sensors provide a value for the reduced B0 field which is used to drive the transducer current such that the oscillation amplitude is kept constant. Improved workflow for the clinical user is provided, as he receives helpful information for correct fixation of transducer.

MR Rheology may be carried out using a transducer composed of field compensated coils driven with low frequency currents inside a B0 field. The device starts oscillating with the frequency of the applied current. The oscillation amplitude is dependent on the current and on the orientation of the device with respect to the external field. For a given current the oscillation amplitude is reduced as soon as the plane of the coil windings is no longer parallel to the B0 field.

Some embodiments of the invention may compensate the effect of tilting of the transducer to a certain amount or constant transducer movement. In case the transducer is mounted to a patient e.g. the effect of transducer tilting by breathing can be compensated.

One or several magnetic field sensors may be incorporated into the transducer such that the B0 field values at the position of the device can be measured in real time. The output of the sensors provide a means for regulating the driving current of the transducer such that the oscillation amplitude can be kept constant during patient or transducer movement as well as after repositioning of the transducer. For optimized penetration of acoustic waves into the body the transducer unit can be angulated with respect to its housing.

Figure 14:
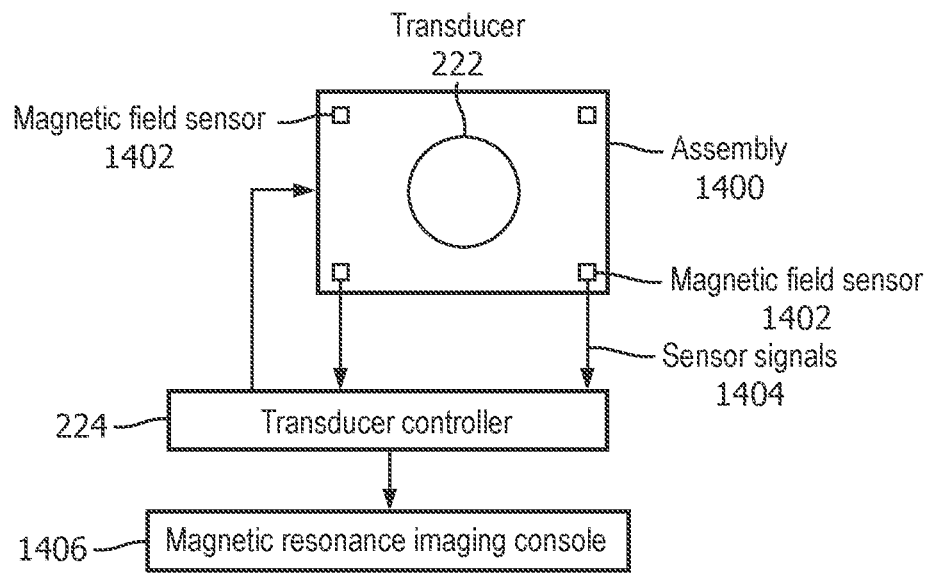
FIG. 14 illustrates a transducer that has been integrated into an assembly comprising magnetic field sensors.

FIG. 14 illustrates a transducer 222 that has been integrated into an assembly 1400 comprising magnetic field sensors 1402. The magnetic field sensors 1402 send sensor signals 1404 to the transducer controller 224. The transducer controller may then adjust the phase and amplitude of the transducer 222. The transducer controller 224 may also send signals to a magnetic resonance imaging console 1406.

In order to provide an error signal for the current through the transducer, field probes are placed on or inside the transducer housing (see FIG. 14). Such field probes may be Hall Sensors or other types of magnetic field probes, e.g. pickup loops.

The sensors are read out and, in case of several sensors, a combination of the signal may be performed. Also several different field measurements may be used for further processing. The measured values are then compared to either a predefined value for B0 or a calibration value determined beforehand. A simple logic provides a deviation signal and feeds it to the input of the current source driving the transducer. This input signal may be filtered using a PID-regulator (proportional/integral/differential). This setup is shown in FIG. 15.

Figure 15:
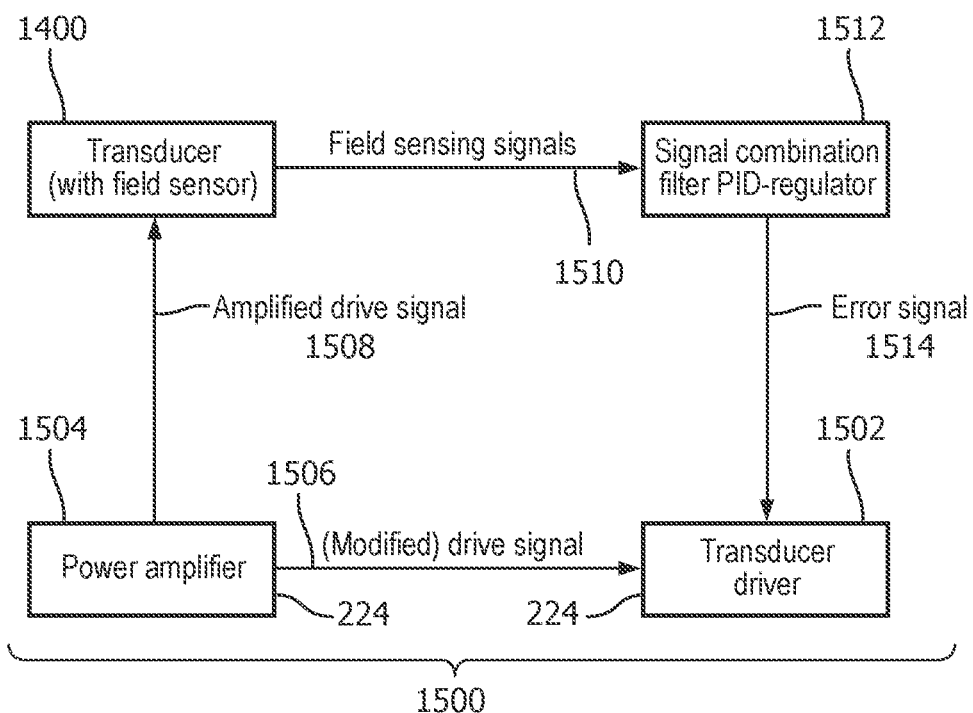
FIG. 15 shows an example of a feedback loop used to control the arrangement shown in FIG. 14.

FIG. 15 shows an example of a feedback loop 1500 used to control the arrangement shown in FIG. 14. There may be a transducer driver which sends a drive signal 1506 to a power amplifier 1504. The transducer driver and the power amplifier may comprise an embodiment of a transducer controller 224. The power amplifier outputs an amplified drive signal 1508 to the transducer in the transducer assembly 1400. The field sensors in the assembly 1400 send field sensing signals 1510 to a signal combination filter 1512. The signal combination filter has a PID-regulator. The signal combination filter 1512 outputs an air signal 1514 to the transducer driver 1502. This forms a closed control loop.

In FIG. 15, a Feedback loop operates the Rheology transducer. Typically a waveform generator is used as a transducer driver providing e.g. a sinusoidal signal. This signal is amplified and applied to the transducer. The invention proposes to add field probes to the transducer. The output signals of those probes are fed to a signal combiner/filter/regulator and this unit adds an error signal upon the driving signal for optimum transducer efficiency and constant oscillation amplitude.

In order to protect the transducer a maximum current provided by the source is also set. This mechanism does not allow the feedback loop to increase the current infinitely which may destroy the transducer.

Positioning of the transducer can be improved for the clinical user by optical or acoustical feedback. Given the output of the field sensors is continuously monitored this signal can be used to derive a transducer position providing maximum oscillation amplitude. An indication of which position provides maximum transducer amplitude can be given by optical visualization using, e.g., a row of, LEDs or an acoustical signal.

The positioning of the transducer is critical and needs a skilled and trained user. To maximize amplitude of acoustic waves in the body, a hinge between housing and oscillator with connected piston defines the optimal excitation angle with respect to the subject. A fast preparation sequence, which only partly covers the center of k-space, provides the necessary feedback information for alignment of the oscillator. B0 sensors are connected at the proper oscillator unit.

MRI Rheology is based on visco-elastic information and leads to a substantial rise in specificity of diagnosis. We propose to dynamically change the mechanical coupling to the subject's body in order maximize coupling and to compensate for motion effects. The offset of the piston is changed by variable length and tilt angle, size and form of the piston may also be variable. The offset of the piston is controlled via an MRI measurement in order to obtain an optimal mechanical wave interface to the body maximizing the wave amplitude for individual patient body size.

Due to variations in the anatomy between patients, workflow is considerably improved since one configurable Rheology device can provide optimum outcome of the procedure. Patient discomfort is prevented.

MR Rheology is an imaging method in which magnetic resonance tomography is used to characterize the mechanical properties of tissue. For this purpose, tissue is driven to oscillate mechanically during imaging, resulting in an additional imaging contrast. Low-frequency mechanical waves are therefore coupled into the tissue and visualized via an MR sequence which is phase-locked to the mechanical excitation. Palpation has turned into the assessment of an objective absolute physical quantity, whose diagnostic value can be quantified.

This information can be used to distinguish tissue (healthy, malign, . . . ) based on its viscoelastic properties and leads to a substantial rise in specificity, e.g., for cancer diagnosis. A number of different transducers for employing the mechanical oscillation to the tissue have been proposed and demonstrated namely electromagnetic designs, which make use of the B0-field inside the MR scanner. Piezo-driven transducers or pneumatic designs were proposed for clinical application.

The oscillation of the tissue is achieved by attaching a mechanical oscillator to the patient close to the imaging region of interest. The oscillator can be based on an electromechanical converter, like an AC current driven coil, oscillating in a static magnetic B0 field. The mechanical excitation of the tissue is generated using a piston with a fixed size, length and position.

Individual adaptation to the subject can provide optimal coupling and thus good mechanical wave transmission into the body for optimal reconstruction, which is mandatory.

Today, the magnitude of the oscillation is manually adjusted based on experiences, e.g. by setting the electrical current through the coil of the electromechanical oscillator mentioned. Problems which may be addressed by some embodiments of the invention:

Mechanical matching to the patient's body is suboptimal for rigid transducer setup
Individual adaptation to patient bodies of different size is not provided
Adaptation to local tissue boundaries is not possible
Motion and breathing is not compensated in typical designs
Vibration at maximum level not controlled
Patient comfort is not guaranteed The offset of the piston of a Rheology oscillator is controlled via an MRI measurement and optimal interfacing of the mechanical wave to the body providing optimal wave amplitude for individual patient body size is guaranteed and provides an efficient help for positioning.

Different parameters can be electromechanically changed/adapted e.g. the length of the piston, tilt angle, or diameter of the contact surface of the piston. Especially for varying patient sizes and thus changing fat distribution in the body, the settings of the Rheology unit for achieving good imaging results can be adapted. An automatic tuning mechanism based on imaging data and monitored oscillator data will improve its performance. Vibration at maximum level is excluded, which prevents patient discomfort.

Some embodiments of the invention integrate means into the Rheology transducer that provide external variation of device parameters like length of the piston (offset), tilt angle of the piston relative to the oscillator housing and contact surface of the piston to the patient's body.

FIG. 16 illustrates a transducer 1600 according to an embodiment of the invention. In this embodiment there is a piston 1602 of variable length. The piston connects and oscillator 1604 to a contact surface 1608. The contact surface 1608 is operable for being in contact with a surface of the subject and for transferring vibrations to the subject. There is a drive 1606 which enables the piston 1602 to change length. This results in a variable distance 1610.

FIG. 17 shows an alternative transducer design 1700. In this example the contact surface 1608 is tilted with respect to the rest of the transducer 1700. The contact surface 1608 is connected via a piston 1702 to the oscillator 1604. There is a drive 1706 which is operable for rotating the piston 1702. In this way the angle of the contact 1608 may be rotated in the direction 1710. By rotating it the contact angle between the contact surface 1608 and the subject may be changed.

FIG. 18 shows an alternative embodiment of a transducer 1800 according to an embodiment of the invention. This embodiment is similar to the others except in this case the piston 1802 is fixed. The piston communicates oscillations between the oscillator 1604 and the contact surface 1608. In this case the contact surface 1608 has a changeable surface area. For instance the contact surface 1608 may be constructed out of two or more plates and a drive mechanism 1806 may be used to control the spacing between the plates.

FIG. 19 shows a further embodiment of a transducer 1900 according to the invention. In this embodiment there is an inflatable region 1902 mounted on the piston 1802. The drive 1906 is able to either inflate or deflate the inflatable region 1902 thereby causing danger in the form of the contact surface 1608.

FIG. 16 through 19 shows different parameters of the piston that can be changed remotely during a Rheology session for improved outcome. The Rheology applicator as central element is driven by an audio frequency amplifier (here: the example of an AC current driven coil). The amplifier input signal and the input of the offset is calculated based on a set of values gained by MRI measurements:

The direct link between the MR console and the offset driving interface and control allows synchronizing imaging sequences and application of the mechanical oscillation parameter set. Furthermore, real time data of the MRI imaging sequence are used at the input for the feedback control so that the oscillator with dynamic piston is only switched on when needed. Auto-calibration of feedback loop and preset data for different subjects (weight, fat, imaging data, database) is implemented in the software, which controls the loop. The process described is executed once at the beginning of a MRI Rheology measurement, and is repeated continuously during the measurement to compensate for different mechanical matching during motion and movement of the patient.

Figure 20:
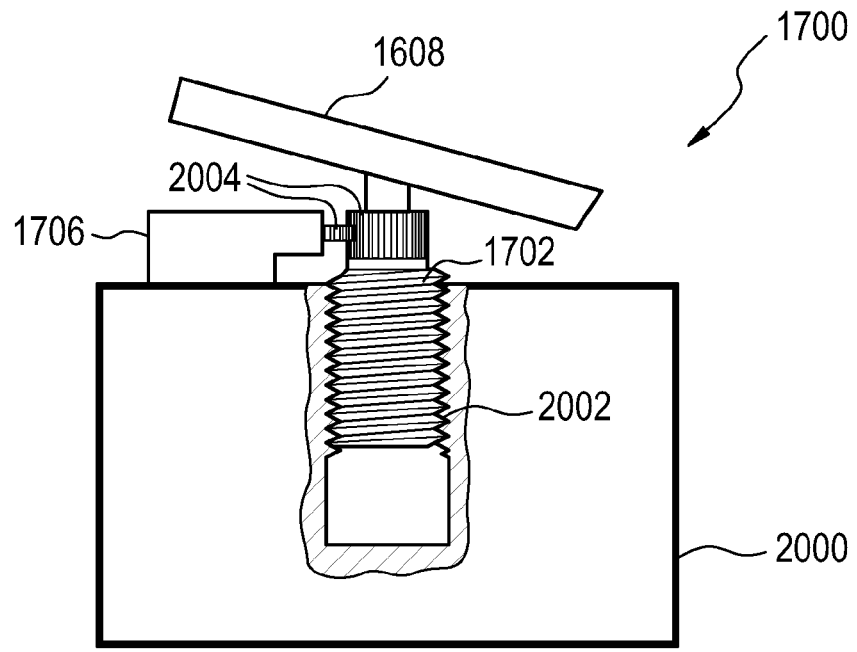
FIG. 20 shows an implementation of the transducer embodiment shown in FIG. 17.

FIG. 20 shows one example of how to realize such a device. The piston is firmly attached to the oscillator via a screw-like connection. There are more windings/space than required for the mechanical fixation. By turning the piston, the distance of oscillator and piston (patient) can be adjusted. For this, the piston has a vertical cog wheel, where the distance driver is attached with a matching second cog wheel. By driving only a fraction of a turn, the angle of the piston can be changed FIG. 20 shows one implementation of the embodiment shown in FIG. 17. FIG. 20 shows a transducer 1700. There is an oscillator in a housing 2000 which have windings 2002 mounted inside of them. A driver 1706 drives gears 2004. Driving the gears 2004 causes the piston 1702 to rotate in the windings 2002. This causes the piston 1702 to move in or out of the oscillator housing 2000. In this example the contact surface 1608 is tilted at an angle. As the driver 1706 rotates the gears 2004 the contact surface 1608 will rotate around the center of axis of the windings and also the piston 1706 will change its distance.

Figure 21:
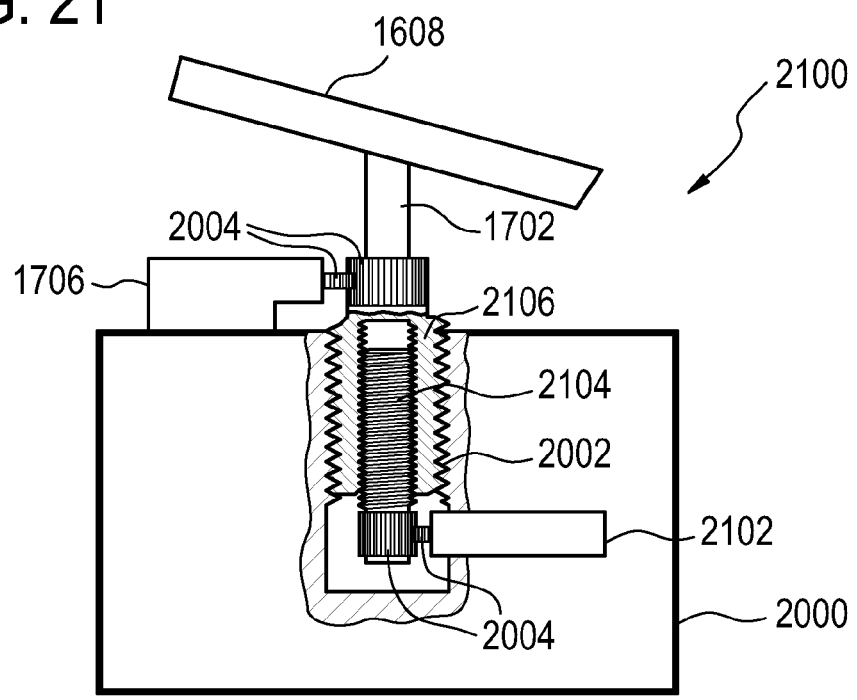
FIG. 21 shows an alternative embodiment of the transducer embodiment show in FIG. 20.

FIG. 21 shows an improved version of the embodiment shown in FIG. 20. FIG. 21 shows a transducer 2100. In this case a second driver 2102 has been added. The driver 2102 turns the gears 2104. These cause the piston 1702 to rotate on threads or windings 2104. The driver 1706 causes the gears 2004 to rotate which are mounted for rotating a hollow screw 2106. The windings 2104 or threads are mounted between the piston 1706 and the hollow screw 2106. By controlling the drivers 1706 and 2102 both the displacement of the piston 1706 and the angle that the surface 1708 is rotated to may both be controlled.

FIG. 21 shows how both functions can be combined. The screw driven from the first driver is hollow, and equipped with inner windings. Those windings hold the piston. On the lower end the piston itself has a second vertical cog wheel. Driving this via the second driver changes the angle of the piston. Driving both drivers at the same time (in different directions same angular speed) changes the height, provided that one is equipped with a coarse thread and one is equipped with a fine thread In FIG. 21, different options for modified coupling of the piston to the body are shown: offset in length, tilting of the piston with respect to the transducer housing, variable contact surface to the body.

The drive for offsetting the piston may be realized by pneumatic devices, a piezo motor or Bowden cables, transmitting force generated outside the MR scanner to the offset mechanics.

Communication between the transducer and MRI system is performed using for example optical or wireless technology.

FIG. 22 shows an example of a control loop 2200 for automatically configuring the performance of the transducer 222. For example a magnetic resonance scan 2202 can be used as an input to the transducer controller 224. In this example the transducer controller 224 comprises an analogue-to-digital conversion and logic unit 2203 which provides commands to an audio amplifier 2205. The controller 2203 also provides a signal to the transducer 222 including any of the adjustments possible shown in the embodiments of FIGS. 16-21. The rheology transducer 222 may also provide direct feedback to the controller 2203. For instance if the piston length is adjustable the transducer may provide encoder data descriptive of the piston length 2204. If the piston angle is adjustable the transducer 222 may provide encoder data descriptive of the piston angle 2206. If the transducer is able to change the surface area of the contact surface or the piston diameter, the transducer 222 may provide encoder data descriptive of the area of the contact surface 2208. If the transducer has an adjustable piston size the transducer 222 may provide feedback to the controller 2203 descriptive of encoder data descriptive of the piston size 2210.

FIG. 22: Schematic on how the Rheology transducer is automatically configured for optimum performance. The transducer is equipped with encoders which can deliver data on piston length tilt angle, diameter or size. These data are fed to a logic-unit (hard or software) which also receives the result of a Rheology test-scan (prescan). Depending on the quality of the scan the parameters and/or the driving power for the transducer are adjusted. Another scan verifies the outcome. This loop can be run before the exam or even interleaved with the exam always providing best possible outcome. Patient discomfort is prevented.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 200 medical instrument
202 magnetic resonance imaging system
204 magnet
206 bore of magnet
208 imaging zone
210 magnetic field gradient coils
212 magnetic field gradient coil power supply
214 radio-frequency coil
216 transceiver
218 subject
220 subject support
222 transducer
224 transducer controller
226 direction of vibrations
228 first region of interest
230 second region of interest
232 computer system
234 hardware interface
236 processor
238 user interface
240 computer storage
242 computer memory
250 first spatially encoding pulse sequence
252 magnetic resonance data
254 second spatially encoding pulse sequence
256 navigator data
258 navigator profile
260 parameter
262 magnetic resonance rheology image
264 control module
266 navigator profile construction module
268 parameter calculation module
270 rheology image reconstruction module
400 medical instrument
402 vibration sensor
404 sensor data
500 medical instrument
502 rheology applicator
504 driving signal and sensing lines
600 feedback control loop
602 feedback controller
604 demand signal
606 amplifier
608 amplifier feedback
610 rheology applicator/transducer
612 indirect feedback at transducer
614 direct feedback t transducer
616 vibration sensor
618 vibration sensor feedback
620 image reconstruction feedback
622 MR console feedback
700 operator
702 signal to operator
704 control logic
706 comparator
708 look up table 2
710 digital to analog converter
712 analog to digital converter
714 look up table 1
716 switch
800 magnitude of test image
802 phase of test image
804 magnitude in k-space
806 phase in k-space
808 single bright spot
902 phase of test image
904 magnitude in k-space
906 phase in k-space
908 multiple bright spots
1002 phase of test image
1004 magnitude in k-space
1006 phase in k-space 1008 multiple bright spots
1100 cross section of image 800
1102 cross section of image 802
1104 magnitude in k-space
1106 phase in k-space
1108 peak
1202 cross section of image 902
1204 magnitude in k-space
1206 phase in k-space
1208 multiple peaks
1302 cross section of image 1002
1304 magnitude in k-space
1306 phase in k-space
1308 multiple peaks
1400 assembly
1402 magnetic field sensors
1404 sensor signal
1406 MRI console
1500 feedback loop
1502 transducer driver
1504 power amplifier
1506 drive signal
1508 amplified drive signal
1510 field sensing signals
1512 signal combination filter
1514 error signal
1600 transducer
1602 piston
1604 oscillator
1606 drive
1608 contact surface
1610 variable distance
1700 transducer
1702 piston
1706 drive
1800 transducer
1802 piston
1806 drive
1810 direction of expansion
1900 transducer
1902 inflatable region
1906 drive
2000 oscillator and housing
2002 windings
2004 gears
2100 transducer
2102 driver
2104 windings
2106 hollow screw
2200 control loop
2202 Magnetic resonance scan
2203 analog to digital converter and logic controller
2204 encoder data: piston length
2205 audio amplifier
2206 encoder data: piston angle
2208 encoder data: piston diameter
2210 encoder data: piston size

The invention claimed is:

1. A medical instrument comprising:
a magnetic resonance imaging system for acquiring magnetic resonance data from a subject at least partially within an imaging zone;
a transducer for mechanically vibrating at least a portion of the subject within the imaging zone;
a transducer controller for controlling the amplitude and phase of vibrations of the transducer;
a processor for controlling the medical instrument;
a memory for storing machine executable instructions for execution by the processor, wherein execution of the instructions causes the processor to:
control the transducer to vibrate;
control the magnetic resonance imaging system to repeatedly acquire the magnetic resonance data from a first region of interest using a first spatially encoding pulse sequence during vibration of the transducer;
control the magnetic resonance imaging system to acquire navigator data from a second region of interest using a second spatially encoding pulse sequence, wherein the execution of the instructions causes the acquisition of the magnetic resonance data to be interleaved with the acquisition of the navigator data;
construct a set of navigator profiles using the navigator data;
determine at least one parameter descriptive of transducer vibrations using the set of navigator profiles; and
reconstruct at least one magnetic resonance rheology image from the magnetic resonance data.

2. The medical instrument of claim 1, wherein execution of the instructions further causes the processor to detect periodic contrast variations in the set of navigator profiles, wherein execution of the instructions to further causes the processor to determine the least one parameter at least partially by performing any one of the following: determining a transducer amplitude using the periodic contrast variations, determine a transducer phase by determining a distance between periodic contrast variations, and combinations thereof.

3. The medical instrument of claim 1, wherein the medical instrument further comprises a display, wherein execution of the instructions further cause the processor to:
display the at least one parameter on the display during acquisition of the magnetic resonance data;
display a user interface object on the display;
receive a transducer adjustment command from the user interface object;
generate a vibration modification control command using the transducer adjustment command; and
adjust the vibration of the transducer using the transducer controller and the vibration modification control.

4. The medical instrument of claim 1, wherein the medical instrument further comprises a vibration sensor for acquiring sensor data, wherein execution of the instructions further causes the processor to acquire sensor data during the vibration of the transducer, wherein the at least one parameter is partially determined using the sensor data.

5. The medical instrument of claim 4, wherein the vibration sensor is any one of the following: mounted on the transducer and operable for being mounted on a surface of the subject.

6. The medical instrument of claim 4, wherein the vibration sensor is any one of the following: an accelerometer, a strain gauge, pressure gauge, a piezoelectric transducer, a microphone, and combinations thereof.

7. The medical instrument of claim 1, wherein the transducer comprises at least one magnetic sensor for measuring magnetic sensor data, wherein execution of the instructions further comprises determining the at least one parameter at least partially using the magnetic sensor data.

8. The medical instrument of claim 7, wherein the magnetic resonance imaging system comprises a main magnet, wherein the main magnet is operable for generating a B0 magnetic field, wherein determining the at least one parameter at least partially using the magnetic sensor data comprises determining a transducer orientation relative to the B0 field.

9. The medical instrument of claim 7, wherein the magnetic resonance imaging system further comprises an alignment display, wherein execution of the instructions further causes the processor to display the sensor orientation relative to the B0 field on the alignment display during acquisition of the magnetic resonance data.

10. The medical instrument of claim 1, wherein the medical instrument further comprises an adjustable piston, wherein the adjustable piston comprises a contact surface, wherein the adjustable piston is operable for transmitting the vibrations between the transducer and the contact surface, wherein the adjustable piston is operable for being controlled by the processor, wherein execution of the instructions causes the processor to adjust the adjustable piston in accordance with the at least one parameter.

11. The medical instrument of claim 10, wherein the contact surface is operable for being inflated and deflated, wherein the processor is operable for controlling the inflation and deflation of the contact surface, which contact surface may be formed as the surface of an inflatable transducer head or transducer tip.

12. The medical instrument of claim 10, wherein the adjustable piston is operable for adjusting the distance between the transducer and the contact surface, wherein the processor is operable for controlling the distance between the transducer and the contact surface.

13. The medical instrument of claim 10, wherein the contact surface is operable for adjusting an angle between the adjustable piston and the contact surface, wherein the processor is operable for controlling the angle between the transducer and the contact surface.

14. The medical instrument of claim 10, wherein the contact surface has an adjustable surface area, and wherein the processor is operable for controlling the adjustable surface area.

15. A computer program product comprising machine executable instructions for execution by a processor controlling a medical instrument, wherein the medical instrument comprises a magnetic resonance imaging system for acquiring magnetic resonance data from a subject at least partially within an imaging zone, wherein the medical instrument further comprises a transducer for mechanically vibrating at least a portion of the subject within the imaging zone, wherein the medical instrument further comprises a transducer controller for controlling the amplitude and phase of vibrations of the transducer, wherein execution of the instructions causes the processor to:
    control the transducer to vibrate;
    control the magnetic resonance imaging system to repeatedly acquire the magnetic resonance data from a first region of interest using a first spatially encoding pulse sequence during vibration of the transducer;
    control the magnetic resonance imaging system to acquire navigator data from a second region of interest using a second spatially encoding pulse sequence, wherein the execution of the instructions causes the acquisition of the magnetic resonance data to be interleaved with the acquisition of the navigator data;
    construct a set of navigator profiles using the navigator data;
    determine at least one parameter descriptive of transducer vibrations using the set of navigator profiles; and
    reconstruct at least one magnetic resonance rheology image from the magnetic resonance data.

\* \* \* \* \*